United States Patent
Hong et al.

(10) Patent No.: US 7,935,780 B2
(45) Date of Patent: May 3, 2011

(54) HIGH-TEMPERATURE SPIN-ON TEMPORARY BONDING COMPOSITIONS

(75) Inventors: Wenbin Hong, Rolla, MO (US); Sunil K. Pillalamarri, Eagan, MN (US)

(73) Assignee: Brewer Science Inc., Rolla, MO (US)

( * ) Notice: Subject to any disclaimer, the term of this patent is extended or adjusted under 35 U.S.C. 154(b) by 26 days.

(21) Appl. No.: 12/146,148

(22) Filed: Jun. 25, 2008

(65) Prior Publication Data

US 2009/0038750 A1 Feb. 12, 2009

Related U.S. Application Data

(60) Provisional application No. 60/946,077, filed on Jun. 25, 2007.

(51) Int. Cl.
C08G 69/26 (2006.01)
C08G 77/04 (2006.01)
C08G 77/26 (2006.01)
(52) U.S. Cl. ............. 528/350; 528/26; 528/38; 528/353
(58) Field of Classification Search ............... 528/26, 528/38, 350, 353
See application file for complete search history.

(56) References Cited

U.S. PATENT DOCUMENTS

| | | | | |
|---|---|---|---|---|
| 3,234,181 A * | 2/1966 | Olivier | | 528/182 |
| 3,392,144 A * | 7/1968 | Holub | | 528/26 |
| 3,435,002 A * | 3/1969 | Holub | | 528/26 |
| 3,440,204 A * | 4/1969 | Reinhard | | 524/323 |
| 3,553,282 A * | 1/1971 | Holub | | 525/431 |
| 3,598,784 A * | 8/1971 | Holub | | 528/26 |
| 3,598,785 A * | 8/1971 | Holub et al. | | 528/26 |
| 3,723,385 A * | 3/1973 | Hoback | | 528/26 |
| 3,740,305 A * | 6/1973 | Hoback | | 442/266 |
| 3,868,433 A | 2/1975 | Bartz et al. | | |
| 3,959,062 A | 5/1976 | Hoh et al. | | |
| 3,970,494 A | 7/1976 | Pritchard | | |
| 3,987,122 A | 10/1976 | Bartz et al. | | |
| 4,281,100 A * | 7/1981 | Takekoshi | | 528/188 |
| 4,331,799 A * | 5/1982 | Holub et al. | | 528/185 |
| 4,443,591 A * | 4/1984 | Schmidt et al. | | 528/128 |
| 4,474,942 A | 10/1984 | Sano et al. | | |
| 4,480,009 A * | 10/1984 | Berger | | 428/447 |

(Continued)

FOREIGN PATENT DOCUMENTS

EP 0 133 357 12/1988

(Continued)

OTHER PUBLICATIONS

CAS abstract of JP-63-205322, 1988, 2 pages.*

(Continued)

*Primary Examiner* — Randy Gulakowski
*Assistant Examiner* — Robert Loewe
(74) *Attorney, Agent, or Firm* — Hovey Williams LLP

(57) ABSTRACT

New compositions and methods of using those compositions as bonding compositions are provided. The compositions are preferably thermoplastic and comprise imides, amideimides, and/or amideimide-siloxanes (either in polymeric or oligomeric form) dispersed or dissolved in a solvent system, and can be used to bond an active wafer to a carrier wafer or substrate to assist in protecting the active wafer and its active sites during subsequent processing and handling. The compositions form bonding layers that are chemically and thermally resistant, but that can also be softened to allow the wafers to slide apart at the appropriate stage in the fabrication process.

13 Claims, 3 Drawing Sheets

U.S. PATENT DOCUMENTS

| | | | |
|---|---|---|---|
| 4,558,114 A | | 12/1985 | Goel |
| 4,599,396 A | * | 7/1986 | Takekoshi et al. ............ 528/185 |
| 4,710,542 A | | 12/1987 | Forgione et al. |
| 4,793,337 A | | 12/1988 | Freeman et al. |
| 4,895,972 A | * | 1/1990 | Stoakley et al. .............. 528/353 |
| 4,910,288 A | * | 3/1990 | Dellacoletta .................. 528/353 |
| 4,933,132 A | * | 6/1990 | Vora .......................... 264/331.14 |
| 4,973,651 A | * | 11/1990 | Vora ............................... 528/183 |
| 5,043,250 A | | 8/1991 | West et al. |
| 5,187,228 A | * | 2/1993 | Perron et al. ..................... 525/66 |
| 5,204,399 A | * | 4/1993 | Edelman ........................ 524/404 |
| 5,227,461 A | * | 7/1993 | Lubowitz et al. .............. 528/322 |
| 5,773,561 A | | 6/1998 | Sachdev et al. |
| 5,817,744 A | * | 10/1998 | Sheppard et al. .............. 528/353 |
| 5,844,065 A | * | 12/1998 | Liaw et al. ..................... 528/353 |
| 5,886,131 A | * | 3/1999 | Yao et al. ....................... 528/185 |
| 5,888,650 A | | 3/1999 | Calhoun et al. |
| 5,939,520 A | * | 8/1999 | Langsam ....................... 528/350 |
| 6,046,072 A | * | 4/2000 | Matsuura et al. ............. 438/118 |
| 6,054,363 A | | 4/2000 | Sakaguchi |
| 6,066,710 A | * | 5/2000 | Becker et al. ................. 528/170 |
| 6,110,999 A | | 8/2000 | Ourth et al. |
| 6,156,820 A | | 12/2000 | Choi |
| 6,235,818 B1 | | 5/2001 | Morizono et al. |
| 6,252,010 B1 | * | 6/2001 | Takeuchi et al. .............. 525/403 |
| 6,440,259 B1 | | 8/2002 | Patel |
| 6,475,629 B1 | | 11/2002 | Takeuchi et al. |
| 6,548,579 B2 | | 4/2003 | Reski et al. |
| 6,828,020 B2 | | 12/2004 | Fisher et al. |
| 6,858,667 B1 | | 2/2005 | Flerlage et al. |
| 6,869,894 B2 | | 3/2005 | Moore |
| 6,916,681 B2 | | 7/2005 | Asano et al. |
| 6,919,422 B2 | * | 7/2005 | Gallucci et al. ............... 528/353 |
| 6,933,342 B2 | | 8/2005 | Parg et al. |
| 7,084,201 B2 | | 8/2006 | Garfield et al. |
| 7,098,152 B2 | | 8/2006 | Moore |
| 2002/0115263 A1 | | 8/2002 | Worth et al. |
| 2002/0127821 A1 | | 9/2002 | Ohya et al. |
| 2003/0149207 A1 | | 8/2003 | Walter et al. |
| 2003/0168158 A1 | | 9/2003 | Kato |
| 2004/0185187 A1 | | 9/2004 | Yokoyama et al. |
| 2004/0213994 A1 | | 10/2004 | Kozakai et al. |
| 2004/0260021 A1 | | 12/2004 | Macedo et al. |
| 2004/0266947 A1 | | 12/2004 | Macedo et al. |
| 2005/0070684 A1 | * | 3/2005 | Gallucci et al. ............... 528/170 |
| 2005/0164509 A1 | | 7/2005 | Koshimizu et al. |
| 2005/0173064 A1 | | 8/2005 | Miyanari |
| 2005/0181579 A1 | | 8/2005 | Thallner |
| 2005/0191779 A1 | | 9/2005 | Le Vaillant et al. |
| 2006/0003165 A1 | | 1/2006 | Akatsuka et al. |
| 2006/0089487 A1 | * | 4/2006 | Silvi et al. ...................... 528/481 |
| 2006/0183269 A1 | | 8/2006 | Fuergut et al. |
| 2007/0185310 A1 | | 8/2007 | Moore et al. |
| 2008/0173970 A1 | | 7/2008 | Pillalamarri |
| 2008/0200011 A1 | | 8/2008 | Pillalamarri et al. |

FOREIGN PATENT DOCUMENTS

| | | | |
|---|---|---|---|
| EP | 1 700 896 | | 9/2006 |
| JP | 63205322 A | * | 8/1988 |
| WO | WO 91/06587 | | 5/1991 |
| WO | WO 2006/093639 | | 9/2006 |

OTHER PUBLICATIONS

Yi et al., "Synthesis and characterization of poly(amideimide)s containing aliphatic diamine moieties," Die Angewandte Makromolekulare Chemie, 233 (1995), pp. 89-101. (Abstract only).

Puligadda et al., "High-Performance Temporary Adhesives for Wafer Bonding Applications," Mater. Res. Soc. Symp. Proc., vol. 970, 2007.

Pillalamarri et al., "High-Temperature Spin-on Adhesives for Temporary Wafer Bonding," IMAPS 2006: Proceedings of the International Microelectronics and Packaging Society 39th International Symposium on Microelectronics, Oct. 8-12, 2006, pp. 105-111.

Rivas et al., "Thermal Degradation of Copolymers Based on 2-Substituted Oxazoline and β-Methylhydrogenitaconate," Polymer Bulletin, vol. 33, pp. 97-101(1994).

Boustedt et al., "Flip Chip as an Enabler for MEMS Packaging," 2002, 2002 IEEE Electronics Components and Technology Conference, pp. 124-128.

Watanabe et al., "Three-Component Negative-Type Photosensitive Polyimide Precursor Based o Poly(amic acid), a Crosslinker, and a Photoacid Generator," Journal of Polymer Science: Part A, vol. 43, pp. 593-599 (2004).

Frump, "Oxazolines. Their preparation, reactions, and applications," Chem. Rev., 71 (5), 483-505, 1971.

Buna EP T 6250, Lanxess, Lanxess Deutschland GmbH, Business Unit Technical Rubber Products, Product Data Sheet.

Eastman, Eastotac, http://www.eastman.com/brands/eastotac/producthome.asp?product=71016204.

Eastman, Product Data Sheet, Eastotac Resin H-142W, http://eastman.com/productcatalogapps/pagecontrollers/proddatasheet_PC.aspx?

F. Niklaus et al., "Adhesive Wafer Bonding," J. Appl. Phys., 2006, 99, 031101.

J. Moore et al., "High Temperature Resistant Adhesive for Wafer Thinning and Backside Processing," MANTECH 2004, 8.10, 4 pages.

C. Brubaker et al., "Advances in Processing of Compound Semiconductor Substrates," MANTECH 2005, 4 pages.

S. Combe et al., "Reversible Wafer Bonding: Challenges in Ramping up 150mm GaAs Wafer Production to Meet Growing Demand," MANTECH 2006, 4 pages.

Y. Kwon et al., "An Evaluation Process of Polymeric Adhesive Wafer Bonding for Vertical System Integration," Japanese Journal of Applied Physics, vol. 44, No. 6A, 2005, pp. 3893-3902.

Technical DataSheet Abstract Ebecryl 168, UCB Chemicals, Additive, Adhesion promoter/Bonding agent, 2006 SpecialChem S.A., 1 page http://www.specialchem4coatings.com/common/pc/product/displayproduct.aspx?id=12887&srchid=220571.

MatWeb, The Online Materials Database: Zeon Chemicals Zeonex 480R Cyclo Olefin Optical Grade Polymer; Subcategory: Cyclo Olefin Polymer, Polymer, Thermoplastic, 2006, 1 page http://www.matweb.com/search/SpecificMaterialPrint.asp?bassnum=PZEON6.

Frank Niklaus, Adhesive Wafer Bonding Technology, Department of Signals, Sensors and Systems, Royal Institute of Technology (KTH), Stockholm, Sweden, Copyright 2002, 33 pages.

Grunsven et al., "Wafer Level Chip Size Packaging Technology for Power Devices Using Low Ohmic Through-Hole Vias," 14th European Microelectronics and Packaging Conference and Exhibition, Germany, Jun. 23-25, 2003, pp. 46-50.

Fukushima et al., "New Three-Dimensional Integration Technology Using Chip-to-Wafer Bonding to Archive Ultimate Super-Chip Integration," The Japan Society of Applied Physics, vol. 43, Mo. 4B, 2006, 3030-3035.

Library 4 Science, Pinene, 2006, 1 page, http://www.chromatography-online org/topics/pinene.html.

Technical DataSheet Abstract Vanax 808 HP, R.T. Vanderbilt, Additive, Crosslinking Catalyst/Accelerator/Initiator >>Amine or Nitrogen Content, 2006 SpecialChem S.A., 2006, 1 page http://www.specialchem4polymers.com/common/pa/product/displayproduct.aspx?id=7815&srchid=292522.

Ciba Specialty Chemicals, Additives, Polymer Additives, Ciba IRGANOX 1010. Phenolic Primary Antioxidant for Processing and Long-Term Thermal Stabilization, Oct. 1999, 2 pages.

Ciba Specialty Chemicals, Additives, Polymer Additives, Ciba IRGAFOS 168, Hydrolytically Stable Phosphite Processing Stabilizer, Sep. 1999, 2 pages.

Chemical Land 21, Organic Chemicals, Mesitylene, 1 page.

D-limonene. A data sheet from the Compendium of Pesticide Common Names, 1 page.

Safety (MSDS) data for Triton X-100, 1 page.

ExxonMobil Chemical Vistalon, Vistalon 2504 Specifications, 2005, 1 page.

Material Safety Data Sheet, ExxonMobil Chemical Company, Vistalon Ethylene Propylene Rubber, Apr. 14, 2005, 1 page.

IDES, The Plastics Web, Zeonex 480R, 1 page, 2006, http://www.ides.com/grades/ds/E40300.htm.

Eastman Product Data Sheet, Eastotack H-142W Resin, Sep. 13, 2006, 2 pages, http://www.eastman.com/ProductCatalogApps/PageControllers/ProdDatasheet_PC.aspx?p....

Eastman H-142 Resin, Application Uses and Key Attributes, Sep. 13, 2006, 1 page http://www.eastman.com/products/producthome.asp?product=71016204&SelectorUrl=%2....

www.sigma-aldrich.com, 457531 Poly-a-pinene, Sep. 13, 2006, http://www.sigmaaldrich.com/catalog/search/ProductDetail/ALDRICH/457531?PrtPrv=1....

Written Opinion and Search Report dated Feb. 26, 2009 in corresponding PCT application PCT/US2008/068170 filed on Jun. 25, 2008.

* cited by examiner

HIGH-TEMPERATURE SPIN-ON TEMPORARY BONDING COMPOSITIONS

RELATED APPLICATIONS

The present application claims the priority benefit of U.S. Provisional Patent Application Ser. No. 60/946,077, entitled HIGH-TEMPERATURE SPIN-ON BONDING COMPOSITIONS FOR TEMPORARY WAFER BONDING USING SLIDING APPROACH, filed Jun. 25, 2007, incorporated by reference herein

GOVERNMENT FUNDING

This invention was made with government support under contract number W911SR-05-C-0019 awarded by the United States Army Research, Development, and Engineering Command. The United States Government has certain rights in the invention.

BACKGROUND OF THE INVENTION

1. Field of the Invention

The present invention is broadly concerned with novel compositions and methods of using those compositions to form bonding compositions that can support active wafers on a carrier wafer or substrate during wafer thinning and other processing.

2. Description of the Prior Art

Wafer (substrate) thinning has been used to dissipate heat and aid in the electrical operation of the integrated circuits (IC). Thick substrates cause an increase in capacitance, requiring thicker transmission lines, and, in turn, a larger IC footprint. Substrate thinning increases impedance while capacitance decreases impedance, causing a reduction in transmission line thickness, and, in turn, a reduction in IC size. Thus, substrate thinning facilitates IC miniaturization.

Geometrical limitations are an additional incentive for substrate thinning. Via holes are etched on the backside of a substrate to facilitate frontside contacts. In order to construct a via using common dry-etch techniques, geometric restrictions apply. For substrate thicknesses of less than 100 $\mu$m, a via having a diameter of 30-70 $\mu$m is constructed using dry-etch methods that produce minimal post-etch residue within an acceptable time. For thick substrates, vias with larger diameters are needed. This requires longer dry-etch times and produces larger quantities of post-etch residue, thus significantly reducing throughput. Larger vias also require larger quantities of metallization, which is more costly. Therefore, for backside processing, thin substrates can be processed more quickly and at lower cost.

Thin substrates are also more easily cut and scribed into ICs. Thinner substrates have a smaller amount of material to penetrate and cut and therefore require less effort. No matter what method (sawing, scribe and break, or laser ablation) is used, ICs are easier to cut from thinner substrates. Most semiconductor wafers are thinned after frontside operations. For ease of handling, wafers are processed (i.e., frontside devices) at their normal full-size thicknesses, e.g., 600-700 $\mu$m. Once completed, they are thinned to thicknesses of 100-150 $\mu$m. In some cases (e.g., when hybrid substrates such as gallium arsenide (GaAs) are used for high-power devices) thicknesses may be taken down to 25 $\mu$m.

Mechanical substrate thinning is performed by bringing the wafer surface into contact with a hard and flat rotating horizontal platter that contains a liquid slurry. The slurry may contain abrasive media along with chemical etchants such as ammonia, fluoride, or combinations thereof. The abrasive provides "gross" substrate removal, i.e., thinning, while the etchant chemistry facilitates "polishing" at the submicron level. The wafer is maintained in contact with the media until an amount of substrate has been removed to achieve a targeted thickness.

For a wafer thickness of 300 $\mu$m or greater, the wafer is held in place with tooling that utilizes a vacuum chuck or some means of mechanical attachment. When wafer thickness is reduced to less than 300 $\mu$m, it becomes difficult or impossible to maintain control with regard to attachment and handling of the wafer during further thinning and processing. In some cases, mechanical devices may be made to attach and hold onto thinned wafers, however, they are subject to many problems, especially when processes may vary. For this reason, the wafers ("active" wafers) are mounted onto a separate rigid (carrier) substrate or wafer. This substrate becomes the holding platform for further thinning and post-thinning processing. Carrier substrates are composed of materials such as sapphire, quartz, certain glasses, and silicon, and usually exhibit a thickness of 1000 $\mu$m. Substrate choice will depend on how closely matched the coefficient of thermal expansion (CTE) is between each material.

One method that has been used to mount an active wafer to a carrier substrate comprises the use of a cured bonding composition. The major drawback with this approach is that the composition must be chemically removed, typically by dissolving in a solvent. This is very time-consuming, thus reducing throughput. Furthermore, the use of the solvent adds to the cost and complexity of the process, and it can be hazardous, depending upon the solvent required to dissolve the bonding composition.

Another method for mounting an active wafer to a carrier substrate is via a thermal release adhesive tape. This process has two major shortcomings. First, the tapes have limited thickness uniformity across the active wafer/carrier substrate interface, and this limited uniformity is often inadequate for ultra-thin wafer handling. Second, the thermal release adhesive softens at such low temperatures that the bonded wafer/carrier substrate stack cannot withstand many typical wafer processing steps that are carried out at higher temperatures.

There is a need for new compositions and methods of adhering an active wafer to a carrier substrate that can endure high processing temperatures and that allow for ready separation of the wafer and substrate at the appropriate stage of the process.

SUMMARY OF THE INVENTION

The present invention overcomes the problems of the prior art by broadly providing a wafer bonding method which includes providing a stack comprising first and second substrates bonded together via a bonding composition layer. The layer comprises a compound that can be oligomeric or polymeric, and that is selected from the group consisting of imide, amideimide, and amideimide-siloxane polymers and oligomers. The stack is subjected to a temperature sufficiently high to soften the bonding layer, and then the first and second substrates are separated.

The invention also provides an article comprising first and second substrates. The first substrate comprises a back surface and an active surface, and the active surface comprises at least one active site and a plurality of topographical features. The second substrate has a bonding surface, and there is a bonding layer bonded to the active surface and to the bonding surface. The bonding layer comprises oligomers and polymers, which are selected from the group consisting of imide, amideimide, and amideimide-siloxane polymers and oligomers.

In a further embodiment, the invention is concerned with a polymer or oligomer (or compositions comprising this polymer or oligomer dissolved or dispersed in a solvent system) having a formula selected from the group consisting of

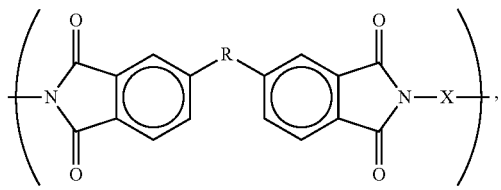

wherein:
R is selected from the group consisting of

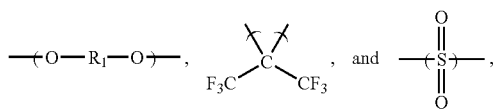

wherein $R_1$ is selected from the group consisting of alkyl-substituted phenyls,

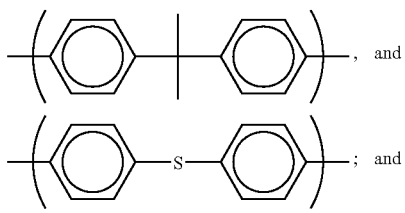

X is selected from the group consisting of phenyl sulfones, aromatics, aliphatics, and cyclic aliphatics; and

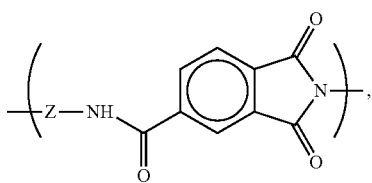

where Z is selected from the group consisting of siloxanes and moieties comprising ether bridges. The compound further comprises an endcap group derived from a compound selected from the group consisting of aromatic mono-amines, aliphatic mono-amines, cyclo-aliphatic mono-amines, and phthalic anhydrides.

DETAILED DESCRIPTION OF THE PREFERRED EMBODIMENTS

Figure 1:
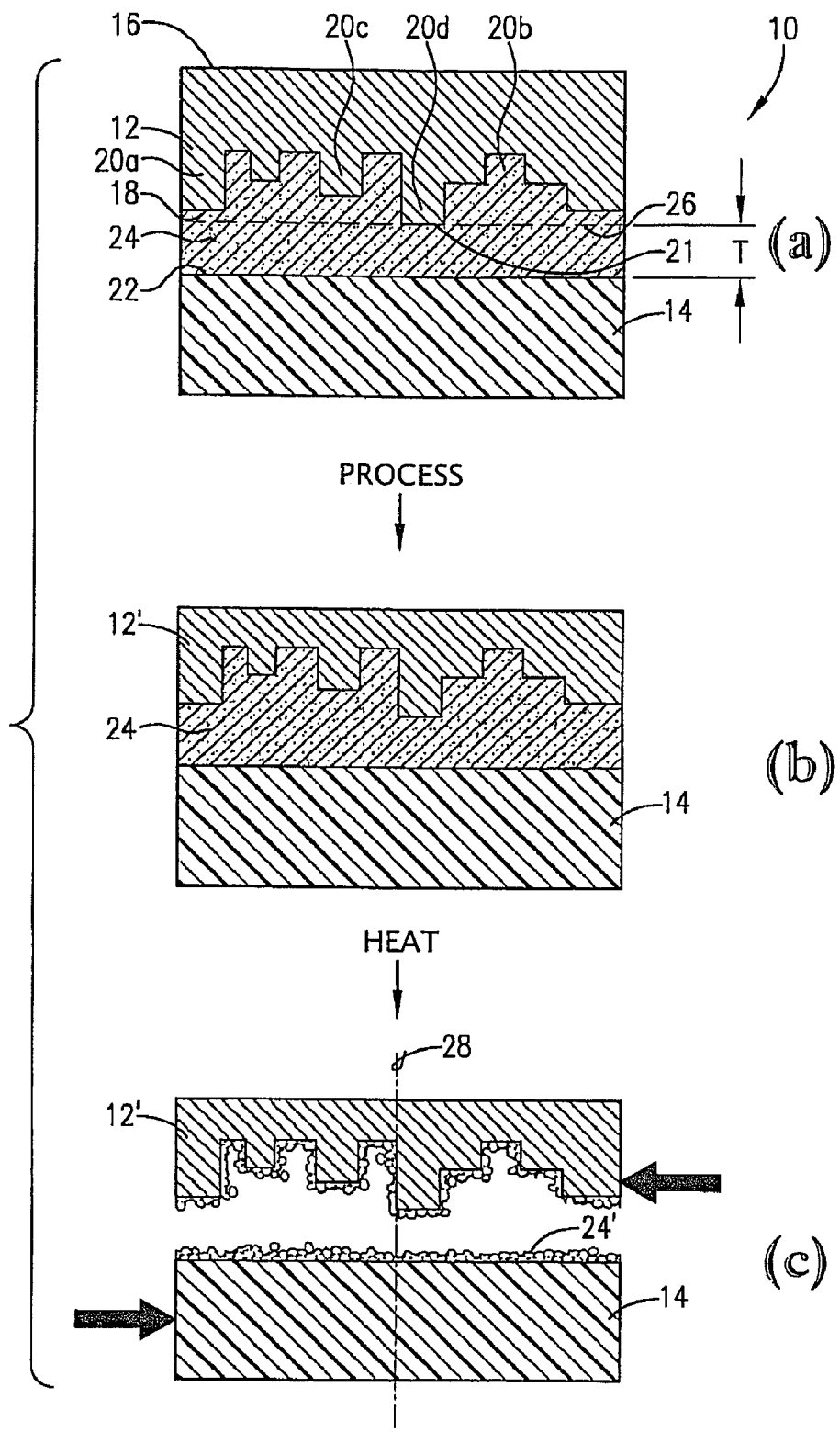
FIG. 1 illustrates the inventive method of thinning and debonding two wafers according to the present invention.

In more detail, the inventive compositions comprise a compound dispersed or dissolved in a solvent system. The compound can be a polymer or an oligomer and is preferably present in the composition at levels of from about 1% to about 70% by weight, more preferably from about 5% to about 50% by weight, and even more preferably from about 15% to about 40% by weight, based upon the total weight of solids in the composition taken as 100% by weight.

The preferred polymeric or oligomeric compounds are thermoplastic and preferably have a weight average molecular weight of from about 3,000 Daltons to about 300,000 Daltons, and more preferably from about 6,000 Daltons to about 50,000 Daltons. Preferred compounds preferably have a softening temperature (melt viscosity at 3,000 Pa·S) of at least about 150° C., more preferably at least about 200° C., and even more preferably from about 200° C. to about 250° C.

Preferred compounds will be at least about 95%, preferably at least about 98%, and even more preferably about 100% by weight dissolved when allowed to sit at ambient temperatures in a solvent such as N-methyl-2-pyrrolidone, xylene, dimethylacetamide, N,N-dimethylformamide, dimethyl sulfoxide, and mixtures thereof, for a time period of about 1-24 hours.

Some preferred compounds that work in the present invention include those selected from the group consisting of oligomers and polymers of imides, amideimides, amideimide-siloxanes, and mixtures thereof.

In one embodiment, preferred such compounds have the formula

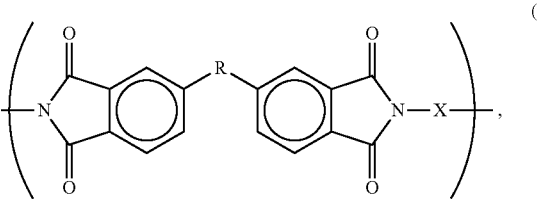

where R is selected from the group consisting of

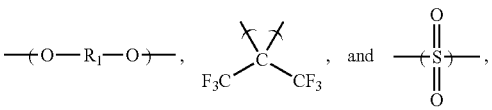

where $R_1$ is selected from the group consisting of alkyl-substituted phenyls,

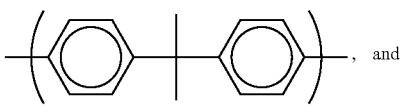

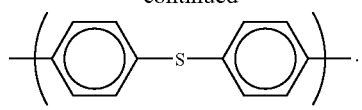

Preferred alkyl-substituted phenyls for use in the present invention are phenyls substituted with $C_1$ to $C_6$ alkyls. Particularly preferred examples of alkyl-substituted phenyls are those selected from the group consisting of

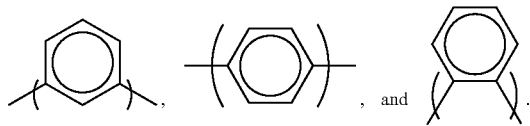

In formula (I) above, X is selected from the group consisting of phenyl sulfones, aromatics (preferably $C_6$ to $C_{60}$, more preferably $C_6$ to $C_{30}$, and even more preferably $C_6$ to $C_{24}$), aliphatics (preferably $C_2$ to $C_{15}$, more preferably $C_2$ to $C_{10}$, and even more preferably $C_2$-$C_6$), and cyclic aliphatics (preferably $C_4$ to $C_{60}$, more preferably $C_4$ to $C_{20}$, and even more preferably $C_4$-$C_{12}$).

In one embodiment, X can be the above aromatic group, aliphatic group, or cyclic aliphatic group. In another embodiment, X can comprise aromatic groups with ether bridges (such as those discussed with respect to Z below) or aromatic groups with linkage groups and/or —NH$_2$ groups at the meta position.

Particularly preferred X groups are selected from the group consisting of alkyl substituted phenyls (such as the ones discussed above), isopropylidenediphenyl, and hexafluoroisopropylidene.

In another embodiment, preferred such compounds have the formula

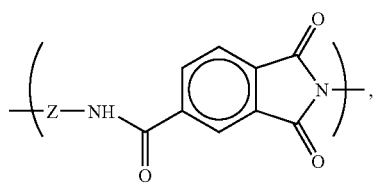

(II)

where Z is selected from the group consisting of siloxanes and moieties comprising ether bridges. In embodiments where Z is a siloxane, preferred siloxanes have the formula

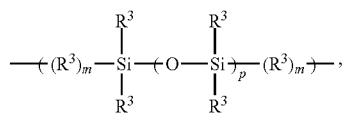

where:
each $R^3$ is individually selected from the group consisting of hydrogen, alkyls (preferably $C_1$ to $C_{10}$, and more preferably $C_1$-$C_2$), and phenyls;
m is 1 to 6; and
p is 1 to 50, preferably 1 to 20, and more preferably 1 to 10.

Preferred moieties comprising ether bridges are selected from the group consisting of

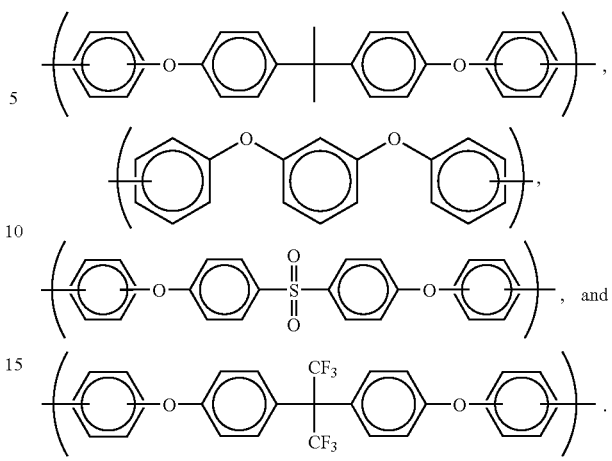

In either the embodiment of Formula (I) or the embodiment of Formula (II), it is preferred that the polymer or oligomer further comprise an endcap group. Preferred endcap groups are derived from a compound selected from the group consisting of aromatic mono-amines, aliphatic mono-amines, cyclo-aliphatic mono-amines, and phthalic anhydrides. Particularly preferred endcap groups have a formula selected from the group consisting of alkyls (preferably $C_1$ to $C_{15}$, more preferably $C_1$ to $C_{10}$, and even more preferably $C_1$-$C_6$),

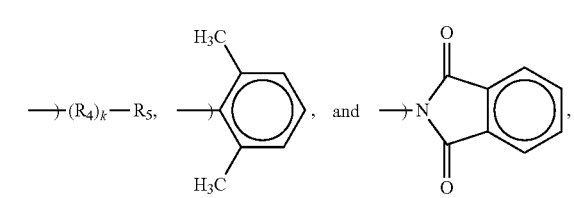

where:
$R_4$ is an alkyl group (preferably $C_1$ to $C_{15}$, more preferably $C_1$ to $C_{10}$, and even more preferably $C_1$-$C_6$);
$R_5$ is a cyclic aliphatic group (preferably $C_3$ to $C_{12}$, and more preferably $C_5$ to $C_6$); and
k is 0 to 20, preferably 0 to 10, and more preferably 0 to 5.

The composition should comprise at least about 30% by weight solvent system, preferably from about 50% to about 90% by weight solvent system, more preferably from about 60% to about 90% by weight solvent system, and even more preferably from about 70% to about 90% by weight solvent system, based upon the total weight of the composition taken as 100% by weight. The solvent system should have a boiling point of from about 100-250° C., and preferably from about 120-220° C.

Suitable solvents include those selected from the group consisting of N-methyl-2-pyrrolidone, xylene, dimethylacetamide, N,N-dimethylformamide, dimethyl sulfoxide, and mixtures thereof.

The total solids level in the composition should be at least about 10% by weight, preferably from about 10% to about 40% by weight, and more preferably from about 10% to about 30% by weight, based upon the total weight of the composition taken as 100% by weight.

In other embodiments, the composition could include a number of optional ingredients, including surfactants, adhesion promoting agents, plasticizers, and/or antioxidants.

When a surfactant is utilized, it is preferably present in the composition at a level of from about 0.1% to about 3% by weight, and more preferably from about 0.1% to about 1% by weight, based upon the total weight of the solids in the composition taken as 100% by weight. Examples of suitable surfactants include alcohol ethoxylates such as octyl phenol ethoxylate (sold wider the name Triton® X-100).

When an adhesion promoting agent is utilized, it is preferably present in the composition at a level of from about 0.1% to about 3% by weight, and preferably from about 0.1% to about 1% by weight, based upon the total weight of the solids in the composition taken as 100% by weight. Examples of suitable adhesion promoting agent include those selected from the group consisting of bis(trimethoxysilylethyl)benzene, aminopropyl tri(alkoxy silanes) (e.g., aminopropyl tri(methoxy silane), aminopropyl tri(ethoxy silanes), -phenyl aminopropyl tri(ethoxy silane)), and other silane coupling agents.

When an antioxidant is utilized, it is preferably present in the composition at a level of from about 0.01% to about 3% by weight, more preferably from about 0.01% to about 1.5% by weight, and even more preferably from about 0.01% to about 0.1% by weight, based upon the total weight of the solids in the composition taken as 100% by weight. Examples of suitable antioxidants include those selected from the group consisting of phenolic antioxidants (such as pentaerythritol tetrakis(3-(3,5-ditert-butyl-4-hydroxyphenyl)propionate sold under the name Irganox® 1010 by Ciba) and phosphite antioxidants (such as tris(2,4-ditert-butylphenyl)phosphite sold under the name Irgafos® 168 by Ciba).

The above ingredients can simply be mixed with the compound in the solvent system. The final composition should be thermoplastic (i.e., noncrosslinkable). Thus, the composition will be essentially free (less than about 0.1% by weight and preferably about 0% by weight) of crosslinking agents.

The melt viscosity of the final composition will preferably be less than about 200 Pa·S, more preferably less than about 100 Pa·S, and even more preferably from about 10 Pa·S to about 50 Pa·S. For purposes of these measurements, the melt viscosity is determined via rheological dynamic analysis (TA Instruments, AR-2000, two parallel-plate configuration where the plates have a diameter of 25 mm). Furthermore, this melt viscosity is determined at 300-350° C. and there is preferably less than about 3% by weight, and more preferably less than about 2% by weight, loss of the composition. In other words, very little to no thermal decomposition occurs in the composition at this temperature, as determined by thermogravimetric analysis (TGA).

Although the composition could be applied to either the carrier substrate or active wafer first, it is preferred that it be applied to the active wafer first. A preferred application method involves spin-coating the composition at spin speeds of from about 300-3,500 rpm (more preferably from about 500-1,500 rpm), at accelerations of from about 500-15,000 rpm/second, and for spin times of from about 30-300 seconds. It will be appreciated that the application steps can be varied to achieve a particular thickness.

After coating, the substrate can be baked (e.g., on a hot plate) to evaporate the solvents. Typical baking would be at temperatures of from about 80-275° C., and preferably from about 150-225° C. for a time period of from about 2-15 minutes, and more preferably from about 3-10 minutes. The film thickness (on top of the topography) after bake will typically be at least about 5 μm, and more preferably from about 5-50 μm.

After baking, the desired carrier wafer is contacted with, and pressed against, the layer of inventive composition. The carrier wafer is bonded to this inventive composition by heating at a temperature of from about 150-300° C., and preferably from about 180-300° C. This heating is preferably carried out under vacuum and for a time period of from about 1-10 minutes, under a bond force of from about 1 to about 15 kilonewtons.

FIG. 1(a) shows an exemplary stack 10 comprising active wafer 12 and carrier wafer or substrate 14. Active wafer 12 comprises a back surface 16 and an active surface 18. Active surface 18 can comprise one or more active sites (not shown) as well as a plurality of topographical features (raised features or lines as well as holes, trenches, or spaces) such as, for example, those designated as 20a-d. Feature 20d represents the "highest" feature on active surface 18. That is, the end portion or surface 21 is further from back surface 16 of wafer 12 than the respective end portions of any other topographical feature on wafer 12.

Typical active wafers 12 can include any microelectronic substrate. Examples of some possible active wafers 12 include those selected from the group consisting of microelectromechanical system (MEMS) devices, display devices, flexible substrates (e.g., cured epoxy substrates, roll-up substrates that can be used to form maps), compound semiconductors, low k dielectric layers, dielectric layers (e.g., silicon oxide, silicon nitride), ion implant layers, and substrates comprising silicon, aluminum, tungsten, tungsten silicide, gallium arsenide, germanium, tantalum, tantalum nitrite, SiGe, and mixtures of the foregoing.

Carrier substrate 14 has a bonding surface 22. Typical carrier substrates 14 comprise a material selected from the group consisting of sapphire, ceramic, glass, quartz, aluminum, silver, and silicon.

Wafer 12 and carrier substrate 14 are bonded together via bonding composition layer 24. Bonding layer 24 is formed of the polymer compositions described above, and has been applied and dried as also described above. As shown in the FIG. 1(a), bonding layer 24 is bonded to active surface 18 of wafer 12 as well as to bonding surface 22 of substrate 14. Unlike prior art tapes, bonding layer 24 is a uniform (chemically the same) material across its thickness. In other words, the entire bonding layer 24 is formed of the same composition.

It will be appreciated that, because bonding layer 24 can be applied to active surface 18 by spin-coating, the bonding composition flows into and over the various topographical features. Furthermore, the bonding layer 24 forms a uniform layer over the topography of active surface 18. To illustrate this point, FIG. 1 shows a plane designated by dashed line 26, at end portion 21 and substantially parallel to back surface 16. The distance from this plane to bonding surface 22 is represented by the thickness "T." The thickness "T" will vary by less than about 8%, preferably by less than about 5%, more preferably by less than about 2%, and even more preferably by less than about 1% across the length of plane 26 and substrate 14.

The wafer package can then be subjected to subsequent thinning (or other processing) of the substrate as shown in FIG. 1(b), where 12' presents the wafer 12 after thinning. It will be appreciated that the substrates can be thinned to thicknesses of less than about 100 μm, preferably less than about 50 μm, and more preferably less than about 25 μm. After thinning, typical backside processing, including photolithography, via etching, and metallization, may be performed.

Advantageously, the dried layers of the inventive compositions possess a number of highly desirable properties. For example, the layers will exhibit low outgassing for vacuum etch processes. That is, if a 15-μm thick film of the composition is baked at 200° C. for 2 minutes, the solvents will be driven from the composition so that subsequent baking at 200° C. for 60 minutes results in a film thickness change of less than about 5%, preferably less than about 2%, and even more preferably less than about 1% or even 0% (referred to as the "Film Shrinkage Test"). Thus, the dried layers can be heated to temperatures of up to about 190° C., preferably up to about 200° C., more preferably up to about 220° C., and even more preferably tip to about 240° C. without physical changes or chemical reactions occurring in the layer. For example, the layers will not soften below these temperatures. In some embodiments, the layers can also be exposed to polar solvents (e.g., PGME) at a temperature of 85° C. for 90 minutes without reacting.

The bond integrity of the dried layers can be maintained even upon exposure to an acid or base. That is, a dried layer of the composition having a thickness of about 15 μm can be submerged in an acidic media (e.g., concentrated sulfuric acid) or base (e.g., 30 wt. % KOH) at 85° C. for about 45 minutes while maintaining bond integrity. Bond integrity can be evaluated by using a glass carrier substrate and visually observing the bonding composition layer through the glass carrier substrate to check for bubbles, voids, etc. Also, bond integrity is maintained if the active wafer and carrier substrate cannot be separated by hand.

After the desired processing has occurred, the active wafer or substrate can be separated from the carrier substrate by heating to temperatures of at least about 200° C., preferably at least about 225° C., and more preferably from about 250° C. to about 350° C. These temperature ranges represent the preferred softening points of the bonding composition layer. This heating will cause the bonding composition layer to soften and form softened bonding composition layer 24' as shown in FIG. 1(*c*), at which point the two substrates can be separated by sliding apart. FIG. 1(*c*) also shows an axis 28, which passes through both of wafer 12 and substrate 14, and the sliding forces would be applied in a direction generally transverse to axis 28. Alternatively, sliding may not be necessary, and instead wafer 12 or substrate 14 can be lifted upward (i.e., in a direction that is generally away from the other of wafer 12 or substrate 14) to separate the wafer 12 from the substrate 14.

It will be appreciated that separation can be accomplished by simply sliding and/or lifting one of wafer 12 or substrate 14 while maintaining the other in a substantially stationary position so as to resist the sliding or lifting force (e.g., by applying simultaneous opposing sliding forces to wafer 12 and substrate 14). This Carl all be accomplished via conventional equipment.

Any bonding composition remaining in the device areas can be easily removed using the original solvent that was part of the composition prior to drying as well as using solvents such as xylene, NMP, and dimethyl sulfoxide. Any composition remaining behind will be completely dissolved (at least about 98%, preferably at least about 99%, and more preferably about 100%) after 5-15 minutes of exposure to the solvent. It is also acceptable to remove any remaining bonding composition using a plasma etch, either alone or in combination with a solvent removal process. After this step, a clean, bonding composition-free wafer 12' and carrier substrate 14 (not shown in their clean state) will remain.

EXAMPLES

The following examples set forth preferred methods in accordance with the invention. It is to be understood, however, that these examples are provided by way of illustration and nothing therein should be taken as a limitation upon the overall scope of the invention.

Example 1

Bisphenol-A-Dianhydride-co-1,3-Phenylenediamine Oligomers End-Terminated with 2,6-Dimethyl Aniline In this procedure, 4,4'-bisphenol-A-dianhydride (BPADA, 57.25 grams, 0.011 moles), m-phenylene diamine (10.81 grams, 0.01 mol), and 2.6-dimethyl aniline (2.42 grams, 0.02 mol) were dissolved in N-methyl-2-pyrrolidone up to a final concentration of 15 wt. % of BPADA. The solution was allowed to stir at room temperature under an inert atmosphere for 12 hours. Xylene (38.17 grams) was added to the resulting amic acid solution to form an azeotropic solution to remove water during imidization, carried out by heating the solution to 180° C. for an additional 12 hours. The resulting imide solution was spin coated at 1,500 rpm for 60 seconds to form void-free, homogeneous films.

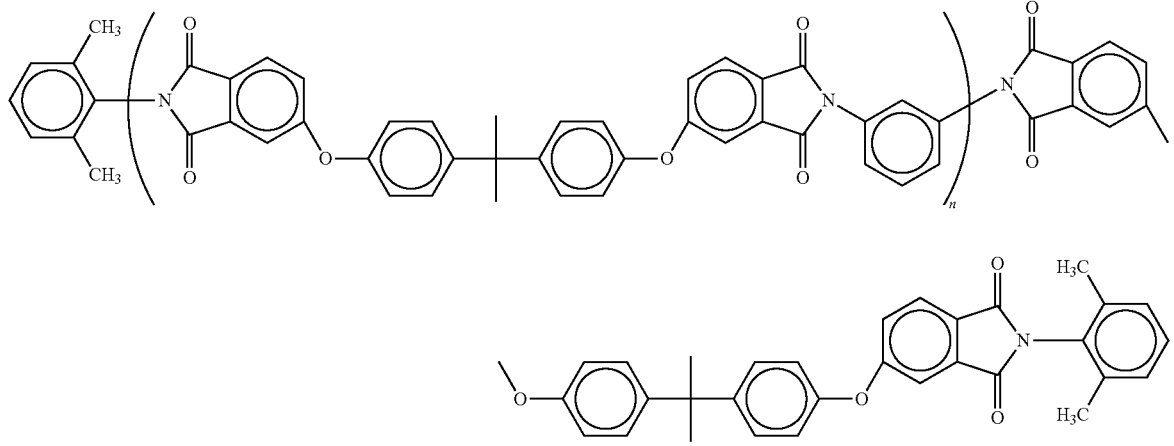

Example 2

Bisphenol-A-Dianhydride-co-1,3-Phenylenediamine Oligomers End-Terminated with n-Butyl Amine In this Example, 4,4'-bisphenol-A-dianhydride (57.25 grams, 0.011 moles), m-phenylene diamine (10.81 grams, 0.01 mol), and n-butyl amine (1.46 grams, 0.02 mol) were dissolved in N-methyl-2-pyrrolidone up to a final concentration of 15 wt. % of BPADA. The solution was allowed to stir at room temperature under an inert atmosphere for 12 hours. After this stage, the resulting poly(amic-acid) solution, with added xylene (38.17 grams), was imidized upon heating to 180° C. under a nitrogen purge for additional 12 hours.

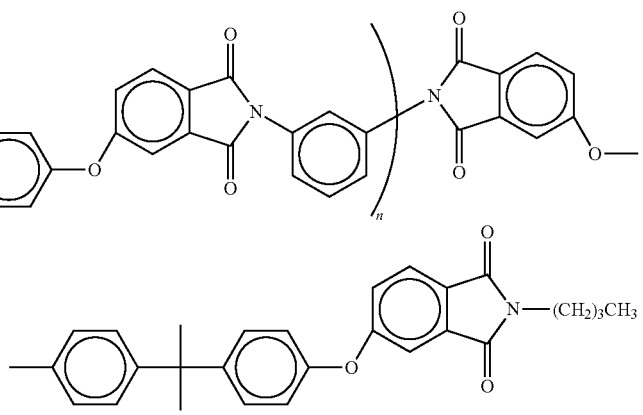

of 15 wt % of BPADA. The solution was allowed to stir at room temperature under an inert atmosphere for 12 hours. Xylene (38.17 grams) was added to the resulting amic acid solution to form an azeotropic solution to remove water during imidization, carried out by heating the solution to 180° C. for an additional 12 hours. The resulting imide solution was spin coated at appropriate speed to form void-free, homogeneous films.

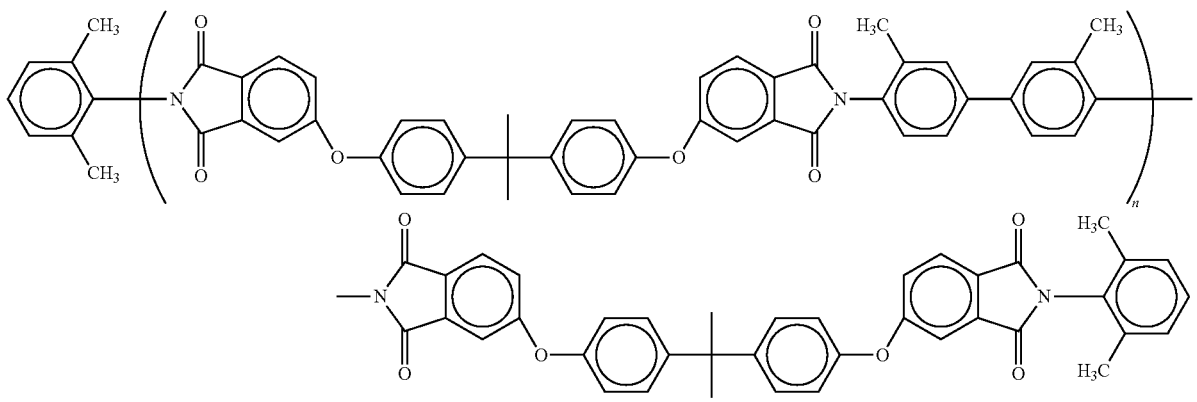

Example 3

Bisphenol-A-Dianhydride-co-O-Tolidine Oligomers End-Terminated with 2,6-Dimethyl Aniline For this procedure, 4,4'-Bisphenol-A-dianhydride (57.25 grams, 0.011 moles), O-Tolidine (21.229 grams, 0.01 mol), and 2.6-dimethyl aniline (2.42 grams, 0.02 mol) were dissolved in N-methyl-2-pyrrolidone up to a final concentration

Example 4

Bisphenol-A-Dianhydride-co-1,3-Phenylenediamine-co-2-Methyl-1,5-Pentanediamine Oligomers End-Terminated with 2,6-Dimethyl Aniline In this example, 4,4'-bisphenol-A-dianhydride (57.25 grams, 0.011 moles), m-phenylene diamine (7.57 grams, 0.007 mol), 2-methyl-1,5-pentanediamine (0.348 grams, 0.003 mol, commercially available from Invista under trade name of DYTEK-A), and 2.6-dimethyl aniline (2.42 grams, 0.02 mol) were dissolved in N-methyl-2-pyrrolidone up to a final concentration of 15 wt. % of BPADA. The solution was allowed to stir at room temperature under an inert atmosphere for 12 hours. Xylene (38.17 grams) was added to the resulting amic acid solution to form an azeotropic solution to remove water during imidization, carried out by heating the solution to 180° C. for an additional 12 hours. The resulting imide solution was spin coated at appropriate speed to form void-free, homogeneous films.

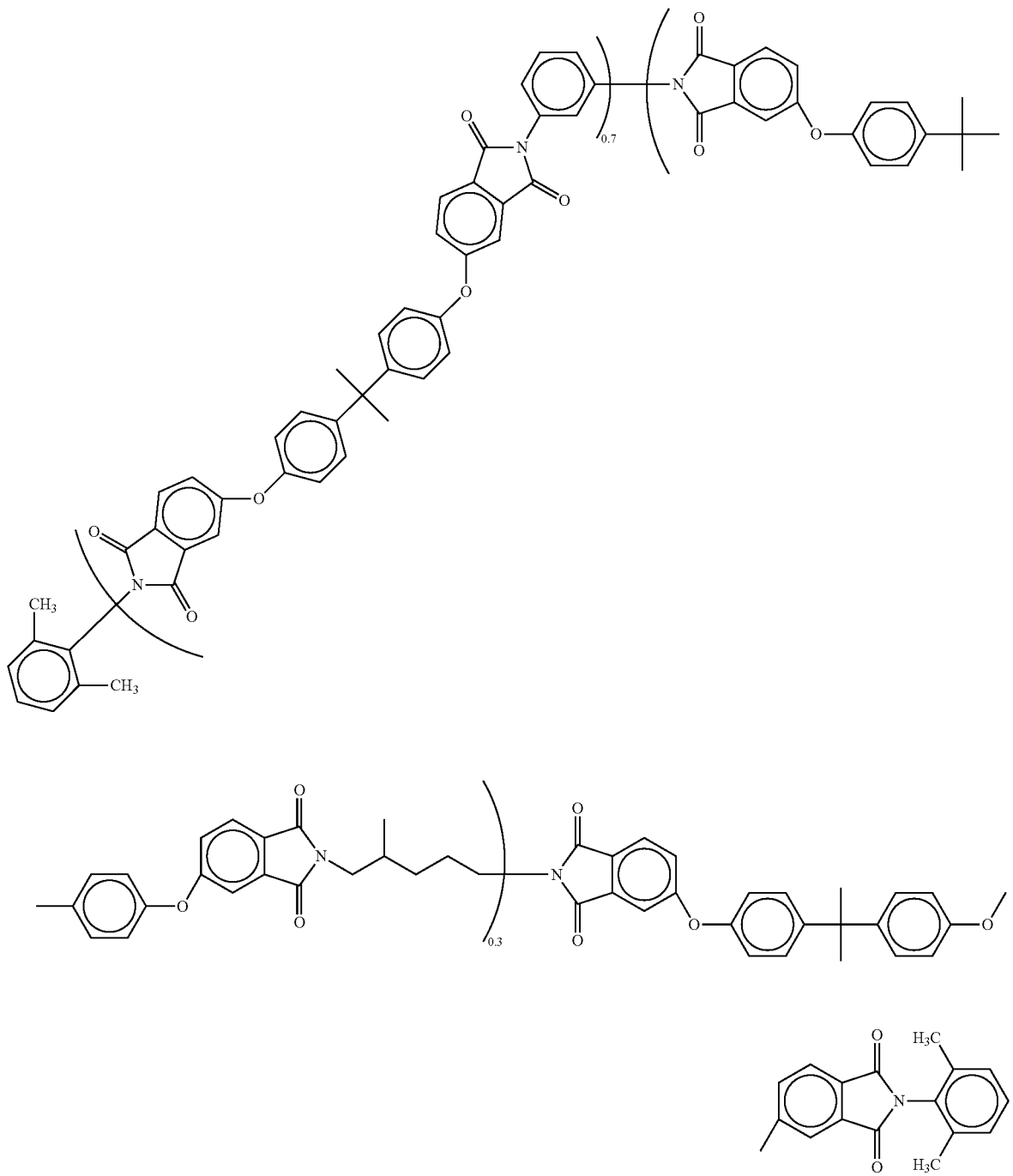

Example 5

Trimellitic Anhydride Chloride-co-2,2-Bis[4-(4-aminophenoxy) Phenyl]Propane-co-Bisphenol A-Dianhydride Oligomers End-Terminated with Phthalic Anhydride In this procedure, trimellitic anhydride chloride (0.447 grams, 2.12 mmol), 2,2-bis[4-(4-aminophenoxy)phenyl]propane (2.0 grams, 4.87 mmol), and triethylamine (0.257 grams, 2.54 mmol) were dissolved in N-methyl-2-pyrrolidone at 0-5° C. to a concentration of 15 wt. % of the total amount of all monomers. The solution was allowed to stir at 0-5° C. under an inert atmosphere for 2 hours. Next, 4,4'-bisphenol-A-dianhydride (1.105 grams, 2.12 mmol), phthalic anhydride (0.199 grams, 1.34 mmol), and additional N-methyl-2-pyrrolidone were added to a final concentration of 15 wt. %. The solution was stirred at room temperature under an inert atmosphere for 20 hours. The resulting precipitate (triethylamine chloride) was filtered, and xylene (2.5 grams) was added to the amic-acid solution to form an azeotropic solution to remove water during imidization, which was carried out by heating the solution to 180° C. for an additional 12 hours. The structure of the polymer is shown below. The resulting amide-imide solution was spin coated at appropriate speed to form void-free, homogeneous films.

Example 6

Trimellitic Anhydride Chloride-co-2,2-Bis[4-(4-Aminophenoxy)Phenyl]Propane Oligomers End-Terminated with Phthalic Anhydride In this Example, trimellitic anhydride chloride (1.0 grams, 4.7 mmol), 2,2-Bis[4-(4-aminophenoxy)phenyl]propane (2.464 grams, 6.0 mmol), and triethylamine (0.571 grams, 5.64 mmol) were dissolved in N-methyl-2-pyrrolidone at 0-5° C. to a concentration of 15 wt. %. The solution was allowed to stir at 0-5° C. under an inert atmosphere for 1 hour. Phthalic anhydride (0.439 grams, 2.96 mmol) and additional N-methyl-2-pyrrolidone were added to a final concentration of 15 wt. %. The solution was stirred at room temperature under an inert atmosphere for 20 hours. The resulting precipitate (triethylamine chloride) was filtered, and xylene (2.6 grams) was added to the amic-acid solution to form an azeo-

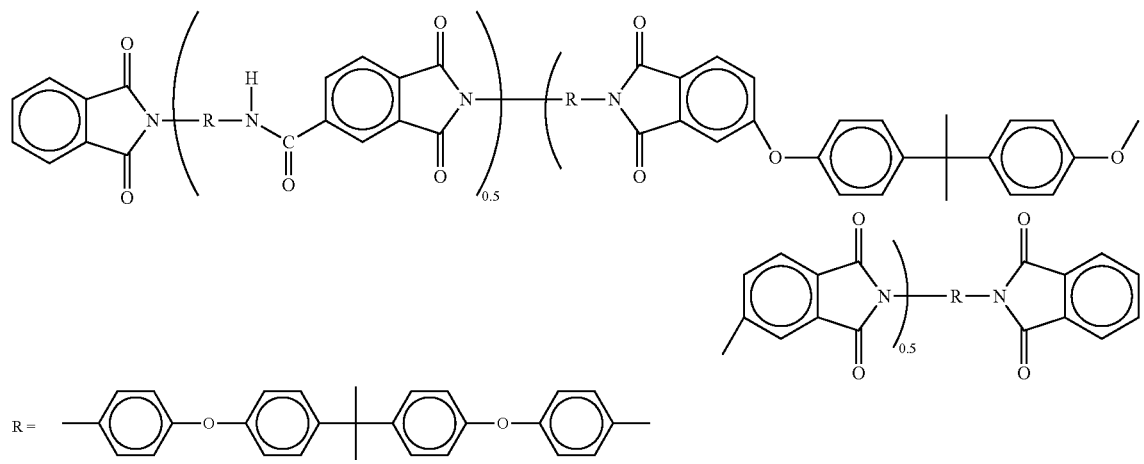

tropic solution to remove water during imidization, which was carried out by heating the solution to 180° C. for additional 12 hours. The resulting amide-imide solution was spin coated at appropriate speed to form void-free, homogeneous films.

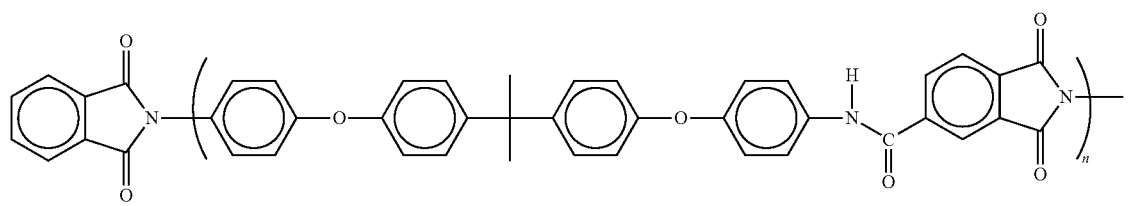

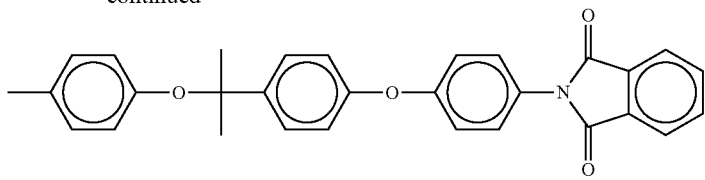

Example 7

Trimellitic Anhydride Chloride-co-1,3-Bis(3-Aminophenoxy) Benzene Oligomers End-Terminated with Phthalic Anhydride In this procedure, trimellitic anhydride chloride (0.69 grams, 3.28 mmol), 1,3-Bis(3-aminophenoxy) benzene (Commercially available from CHRISKEV Company, Inc. under trade name of APB-133, 1.0 grams, 3.42 mmol), and triethylamine (0.398 grams, 3.93 mmol) were dissolved in N-methyl-2-pyrrolidone at 0-5° C. to a concentration of 15 wt. %. The solution was allowed to stir at 0-5° C. under an inert atmosphere for 1 hour. Phthalic anhydride (0.0427 grams, 0.29 mmol) and additional N-methyl-2-pyrrolidone were added to a final concentration of 15 wt. %. The solution was stirred at room temperature under an inert atmosphere for 20 hours. The resulting precipitate (triethylamine chloride) was filtered, and xylene (1.29 grams) was added to the amic-acid solution to form an azeotropic solution to remove water during imidization, carried out by heating the solution to 180° C. for an additional 12 hours. The resulting amide-imide solution was spin coated at appropriate speed to form void-free, homogeneous films.

Example 8

Amide Capped Disiloxane-co-2,2-Bis[4-(4-Aminophenoxy)phenyl]propane-co-Trimellitic Anhydride Chloride Oligomers End-Terminated with Phthalic Anhydride In this procedure, trimellitic anhydride chloride (1.149 grams, 5.46 mmol), 1,3-bis(3-aminopropyl) tetramethyl disiloxane (0.226 grams, 0.91 mmol), and triethylamine (0.663 grams, 6.55 mmol) were dissolved in N-methyl-2-pyrrolidone/THF cosolvent (70/30 vol) at 0-5° C. to a concentration of 15 wt. %. The solution was allowed to stir at 0-5° C. under an inert atmosphere for 12 hours. Next, 2,2-Bis[4-(4-aminophenoxy)phenyl]propane (2.0 grams, 4.87 mmol), phthalic anhydride (0.108 grams, 0.729 mmol), and additional N-methyl-2-pyrrolidone were added to a final concentration of 15 wt. %. The solution was stirred at room temperature under an inert atmosphere for 12 hours. The resulting precipitate (tri-

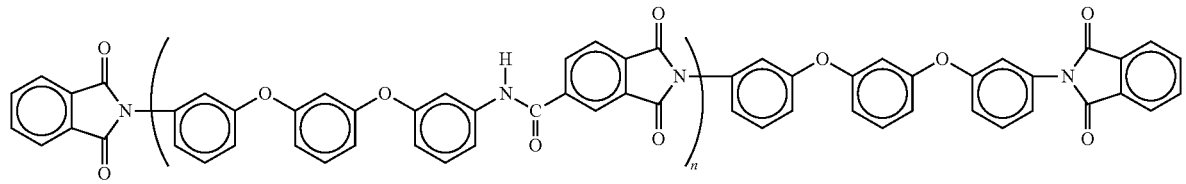

ethylamine chloride) was filtered, and xylene (2.3 grams) was added to the amic-acid solution to form an azeotropic solution to remove water during imidization, which was carried out by heating the solution to 180° C. for an additional 12 hours. The resulting amide-imide-siloxane solution was spin coated at 1,500 rpm for 60 seconds to form void-free, homogeneous films.

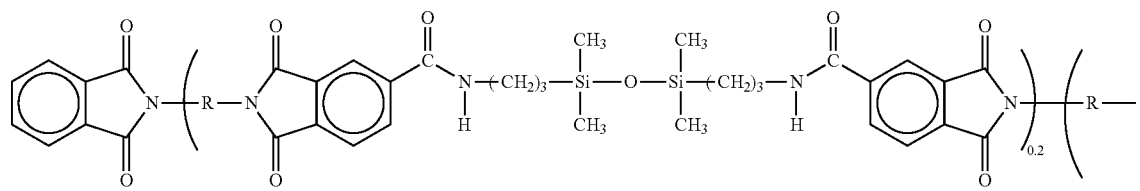

-continued

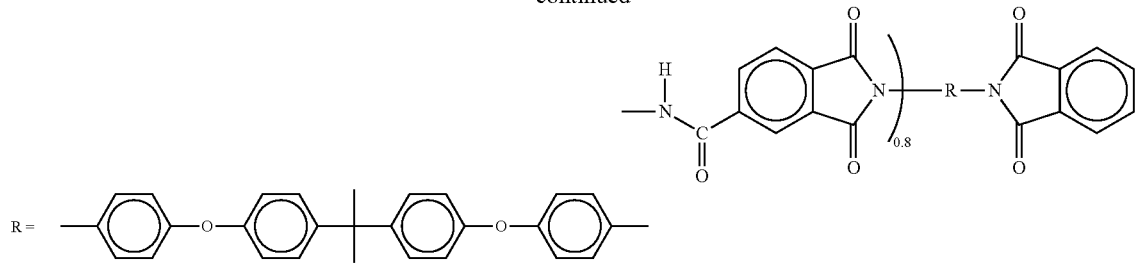

Example 9

Amide Capped Disiloxane-co-2,2-Bis[4-(4-Aminophenoxy)phenyl]propane-co-Bisphenol-A-Dianhydride Oligomers End-Terminated with Phthalic Anhydride In this procedure, trimellitic anhydride chloride (0.372 grams, 1.77 mmol), 1,3-bis(3-aminopropyl) tetramethyl disiloxane (0.220 grams, 0.89 mmol), and triethylamine (0.215 grams, 2.12 mmol) were dissolved in N-methyl-2-pyrrolidone/THF cosolvent (70/30 vol) at 0-5° C. to a concentration of 15 wt. %. The solution was allowed to stir at 0-5° C. under an inert atmosphere for 12 hours. Next, 2,2-Bis[4-(4-aminophenoxy)phenyl]propane (2.0 grams, 4.87 mmol), 4,4'-Bisphenol-A-dianhydride (1.840 grams, 3.54 mmol), phthalic anhydride (0.141 grams, 0.95 mmol), and additional N-methyl-2-pyrrolidone were added to a final concentration of 15 wt. %. The solution was stirred at room temperature under an inert atmosphere for 12 hours. The resulting precipitate (triethylamine chloride) was filtered, and xylene (3.0 grams) was added to the amic-acid solution to form an azeotropic solution to remove water during imidization, which was carried out by heating the solution to 180° C. for an additional 12 hours. The resulting amide-imide-siloxane solution was spin coated at 1,500 rpm for 60 seconds to form void-free, homogeneous films.

Example 10

Amide Capped Polydisiloxane-co-2,2-Bis[4-(4-Aminophenoxy)phenyl]propane-co-Trimellitic Anhydride Chloride Oligomers End-Terminated with Phthalic Anhydride In this Example, trimellitic anhydride chloride (1.080 grams, 5.13 mmol), aminopropyl terminated polydimethylsiloxane (commercially available from Gelest, Inc., 0.420 grams, 0.47 mmol), and triethylamine (0.623 grams, 6.15 mmol) were dissolved in N-methyl-2-pyrrolidone/THF cosolvent (70/30 vol) at 0-5° C. to a concentration of 15 wt. %. The solution was allowed to stir at 0-5° C. under an inert atmosphere for 12 hours. Next, 2,2-Bis[4-(4-aminophenoxy)phenyl]propane (2.0 grams, 4.87 mmol), phthalic anhydride (0.063 grams, 0.425 mmol), and additional N-methyl-2-pyrrolidone were added to a final concentration of 15 wt. %. The solution was stirred at room temperature under an inert atmosphere for 12 hours. The resulting precipitate (triethylamine chloride) was filtered, and xylene (2.4 grams) was added to the amic-acid solution to form an azeotropic solution to remove water during imidization, which was carried out by heating the solution to 180° C. for additional 12 hours. The resulting amide-imide-siloxane solution was spin coated at 1,500 rpm for 60 seconds to form void-free, homogeneous films.

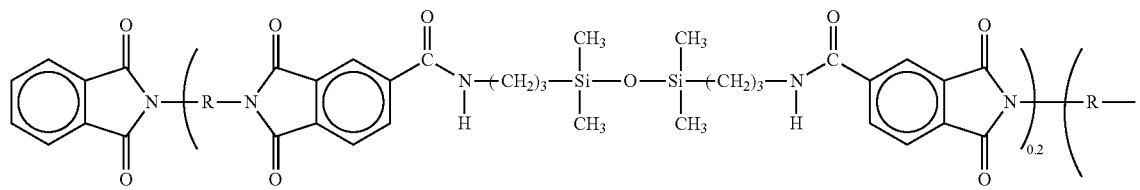

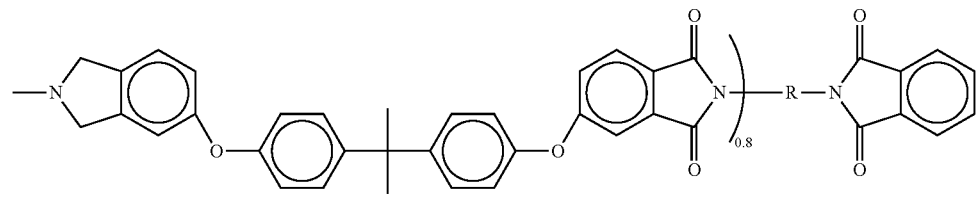

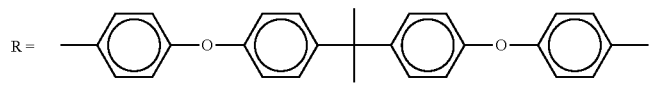

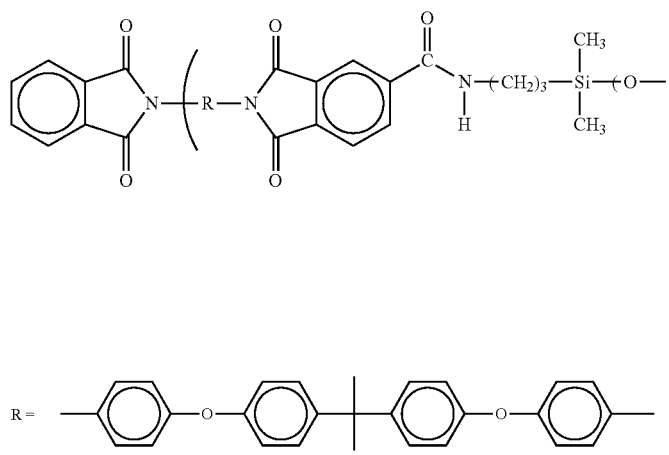
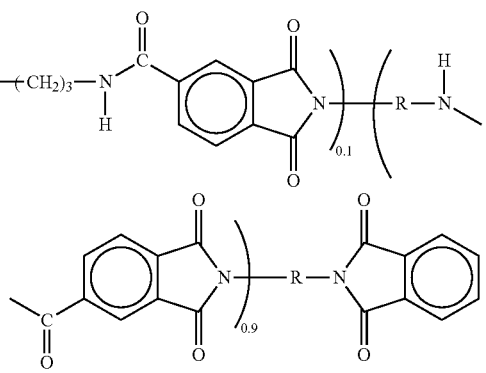
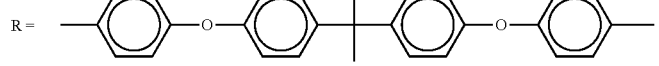

Example 11

Application, Bonding, and Debonding

Figure 2:
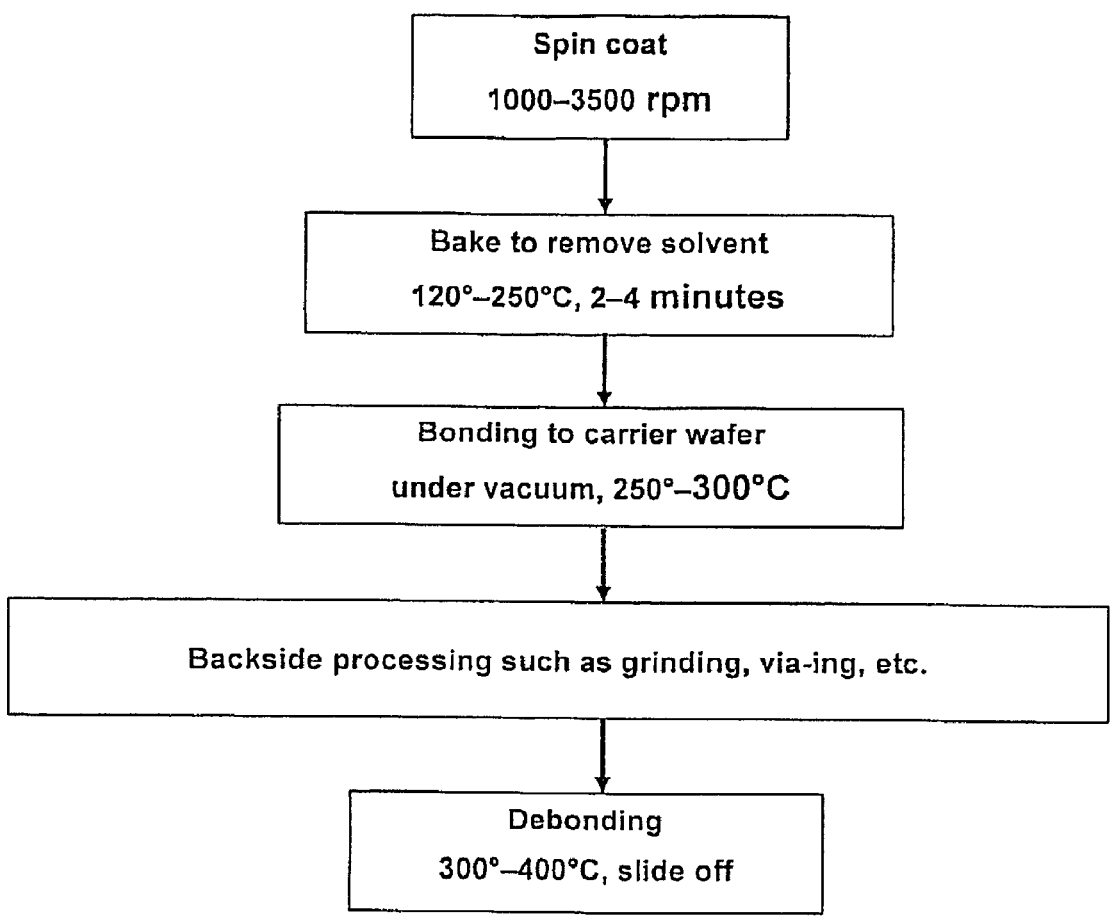
FIG. 2 is a flow diagram showing the typical process steps followed in the examples.

The formulations from Examples 1 through 10 were spin-coated onto various substrate wafers. After baking to evaporate the solvent, a second wafer was bonded to each coated wafer by applying pressure. The typical procedure for temporary wafer bonding using these adhesives is shown in FIG. 2. The bonded wafers were tested for mechanical strength, thermal stability, and chemical resistance. The wafers were tested for de-bonding by manually sliding them apart at acceptable temperatures.

Example 12

Analysis of the Adhesives

Polyimides

The viscosity, softening point, and $T_g$ of the compositions of Examples 1 and 3 are reported in Table 1, and all these materials were successfully tested for de-bonding. Further studies on thermal stability and chemical resistance were carried out on these four compositions. All of these compositions possessed the required thermal stability of at least up to 350° C. and exhibited minimal out-gassing (<0.5 wt. %).

TABLE 1

Properties of Examples 1 and 3

| EXAMPLE | VISCOSITY (Pa · S, 350° C.) | Softening Temperature (in ° C. at 3,000 Pa · S) | Molecular Weight ($M_w$, Daltons) | $T_g$ (° C.) |
|---|---|---|---|---|
| 1 | 50 | 210 | 10,800 | 161 |
| 3 | 15 | 210 | 6,100 | 152 |

Example 13

Analysis of the Adhesives

Polyamideimides

Figure 3:
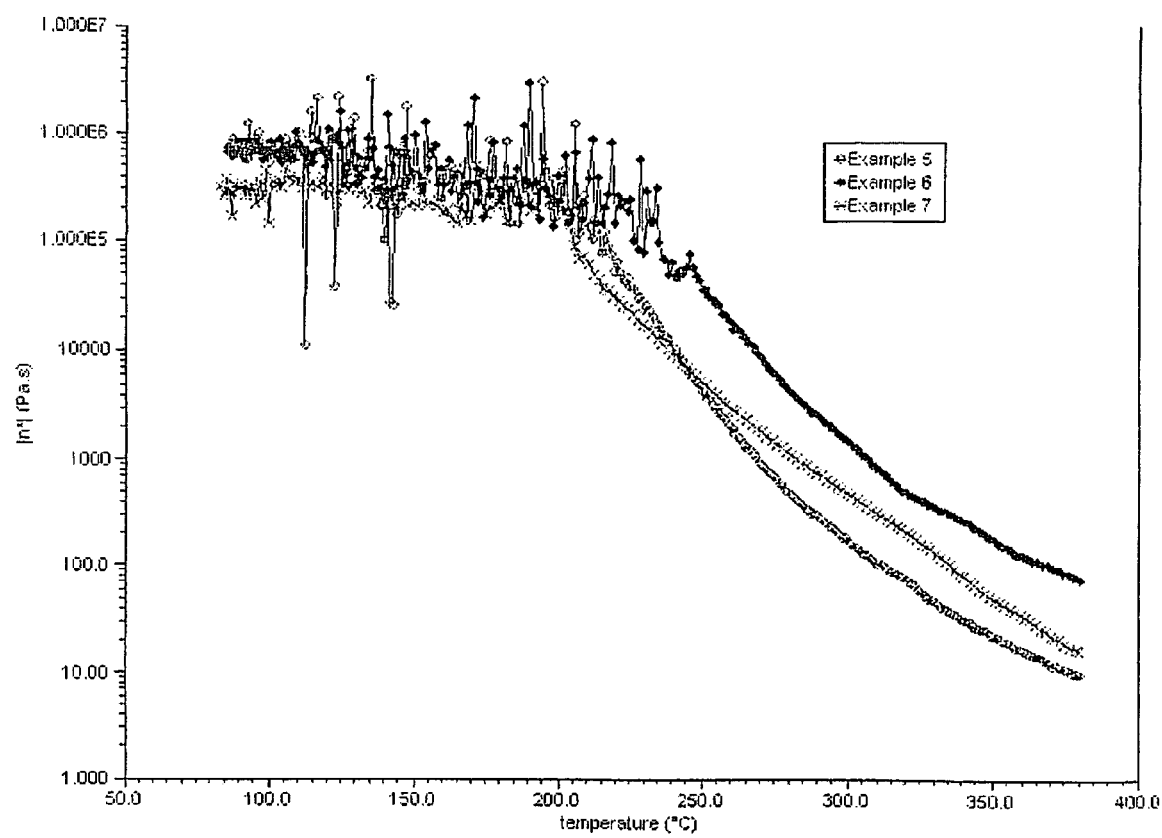
FIG. 3 is a graph depicting the rheological analysis results of a bonding composition according to the invention.

The compositions of the amideimide polymers from Examples 5-7 have aromatic amines that have ether or alkane linkages. As a result, the materials have low softening points, glass transition temperatures, and melt viscosities. The rheology data of the example materials are shown in FIG. 3. The viscosity, softening point, and $T_g$ of the examples are reported in Table 2, and all these materials have been successfully tested for de-bonding. Further studies on thermal stability and chemical resistance have been carried out on these compositions. All of these compositions possess the required thermal stability at least up to 350° C. and exhibit minimal out-gassing (<0.5 wt. %).

TABLE 2

Properties of Examples 5-7

| EXAMPLE | VISCOSITY (Pa · S, 350° C.) | Softening Temperature (in ° C. at 3,000 Pa · S) | Weight Loss (Isothermal at 350° C. for 4 hrs) | Molecular Weight ($M_n$, Daltons) | $T_g$ (° C.) |
|---|---|---|---|---|---|
| 5 | 20 | 253 | 1.337% | 6,000 | 173 |
| 6 | 112 | 282 | 1.561% | 3,000 | 195 |
| 7 | 37 | 255 | 2.218% | 6,000 | 163 |

Example 14

Analysis of the Adhesives

Poly(Amideimide-Siloxane)s

The compositions of the amideimide-siloxane polymers from Examples 8-10 include siloxane units that are capped by amide groups, which form hydrogen bonding inter- and intra-molecularly. As a result, the siloxane units are isolated from phase change and prevented from introducing phase separation. This effect is shown below. The viscosities, softening points, and $T_g$ of the examples are reported in Table 3, and all of these materials were successfully tested for de-bonding. Further studies on thermal stability and chemical resistance have been carried out on these compositions. All of these compositions possess the required thermal stability at least up to 350° C. and exhibit minimal out-gassing (<0.5 wt. %).

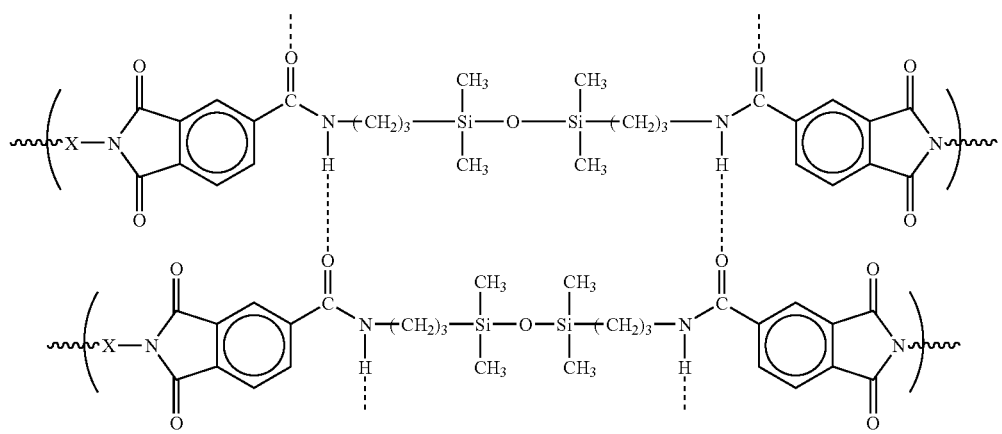

TABLE 3

Properties of Examples 8-10

| EXAMPLE | VISCOSITY (Pa·S, 350° C.) | Softening Temperature (in ° C. at 3,000 Pa·S) | Weight Loss (Isothermal at 350° C. for 4 hrs) | Molecular Weight ($M_n$, Daltons) | $T_g$ (° C.) |
|---|---|---|---|---|---|
| 8 | 44 | 260 | 4.085% | 10,000 | 197 |
| 9 | 67 | 253 | 1.407% | 10,000 | 150 |
| 10 | 1017 | 312 | 2.293% | 16,000 | 150 |

Example 15

Trimellitic Anhydride Chloride-co-2,2-Bis[4-(3-Aminophenoxy)Phenyl]Sulfone-co-Bisphenol-A-Dianhydride Oligomers End-Terminated with Phthalic Anhydride Trimellitic anhydride chloride (2.245 grams, 10.66 mmol), 2,2-Bis[4-(3-aminophenoxy) phenyl]sulfone (10.0 grams, 23.12 mmol), and triethylamine (1.294 grams, 12.79 mmol) were dissolved in N-methyl-2-pyrrolidone at 0-5° C. to a concentration of 15 wt. %. The solution was allowed to stir at 0-5° C. under an inert atmosphere for 1 hour. Bisphenol-A-dianhydride (5.550 grams, 10.66 mmol), phthalic anhydride (0.555 grams, 3.74 mmol), and additional N-methyl-2-pyrrolidone were added to a final concentration of 15 wt. %. The solution was stirred at room temperature under an inert atmosphere for 20 hours. The resulting precipitate (triethylamine chloride) was filtered, and xylene (6.2 grams) was added to the amic-acid solution to form an azeotropic solution to remove water during imidization, carried out by heating the solution to 180° C. for an additional 12 hours. The resulting amide-imide solution was spin coated at 1,500 rpm for 60 seconds to form void-free, homogeneous films.

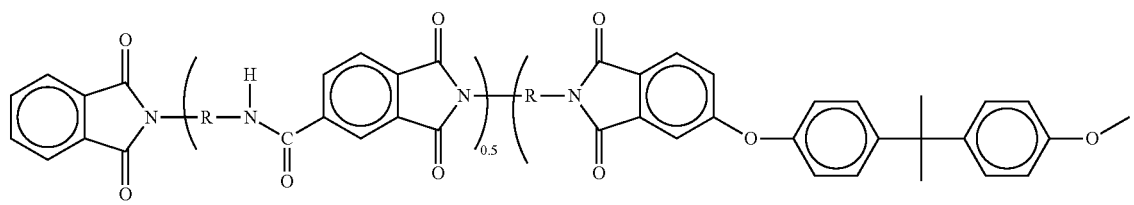

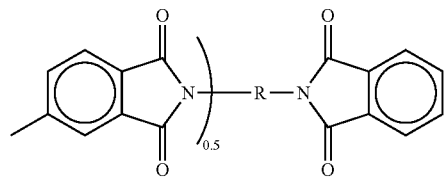

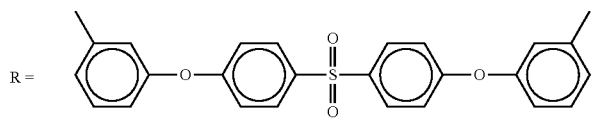

Example 16
Bisphenol-A-Dianhydride-co-2,2-Bis[4-(4-Aminophenoxy)Phenyl]Sulfone Oligomers End-Terminated with Cyclohexylamine In this procedure, 4,4'-Bisphenol-A-dianhydride (10.624 grams, 20.40 mmol), 2,2-Bis[4-(4-aminophenoxy)phenyl]sulfone (8.0 grams, 18.5 mmol), and cyclohexylamine (0.399 grams, 4.0 mmol) were dissolved in N-methyl-2-pyrrolidone up to a final concentration of 10 wt. %. The solution was allowed to stir at room temperature under an inert atmosphere for 12 hours. Xylene (12.0 grams) was added to the resulting amic-acid solution in order to form an azeotropic solution to remove water during imidization, which was carried out by heating the solution to 180° C. for additional 12 hours. The resulting imide solutions were spill coated at 1,500 rpm at 60 seconds to form void free homogeneous films.

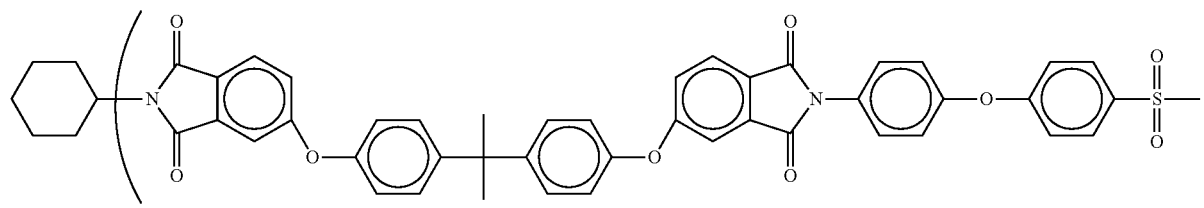

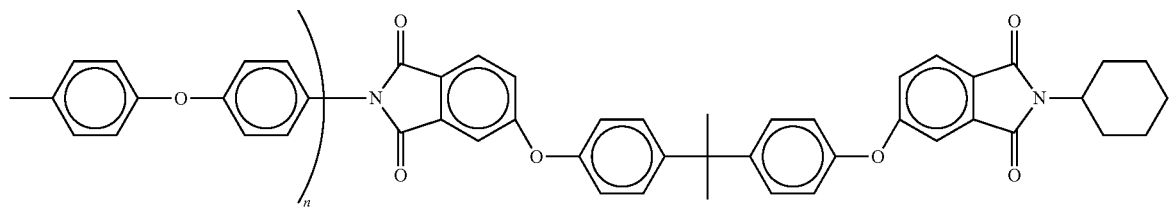

Example 17
Bisphenol-A-Dianhydride-co-2,4,6-Trimethyl-m-Phenylenediamine-co-2-Methyl-1,5-Pentanediamine Oligomers End-Terminated with 2,6-Dimethyl Aniline In this Example, 4,4'-Bisphenol-A-dianhydride (20.0 grams, 38.43 mmol), 2,4,6-trimethyl-m-phenylene diamine (0.811 grams, 5.40 mmol), 2-Methyl-1,5-Pentanediamine (commercially available from Invista under trade name of Dytek-A, 3.556 grams, 30.60 mmol), and 2.6-dimethyl aniline (0.609 grams, 5.03 mmol) were dissolved in N-methyl-2-pyrrolidone up to a final concentration of 10 wt. %. The solution was allowed to stir at room temperature under an inert atmosphere for 12 hours. Xylene (16.6 grams) was added to the resulting amic-acid solution in order to form an azeotropic solution to remove water during imidization, which was carried out by heating the solution to 180° C. for an additional 12 hours. The resulting imide solutions were spin coated at 1,500 rpm at 60 seconds to form void-free, homogeneous films.

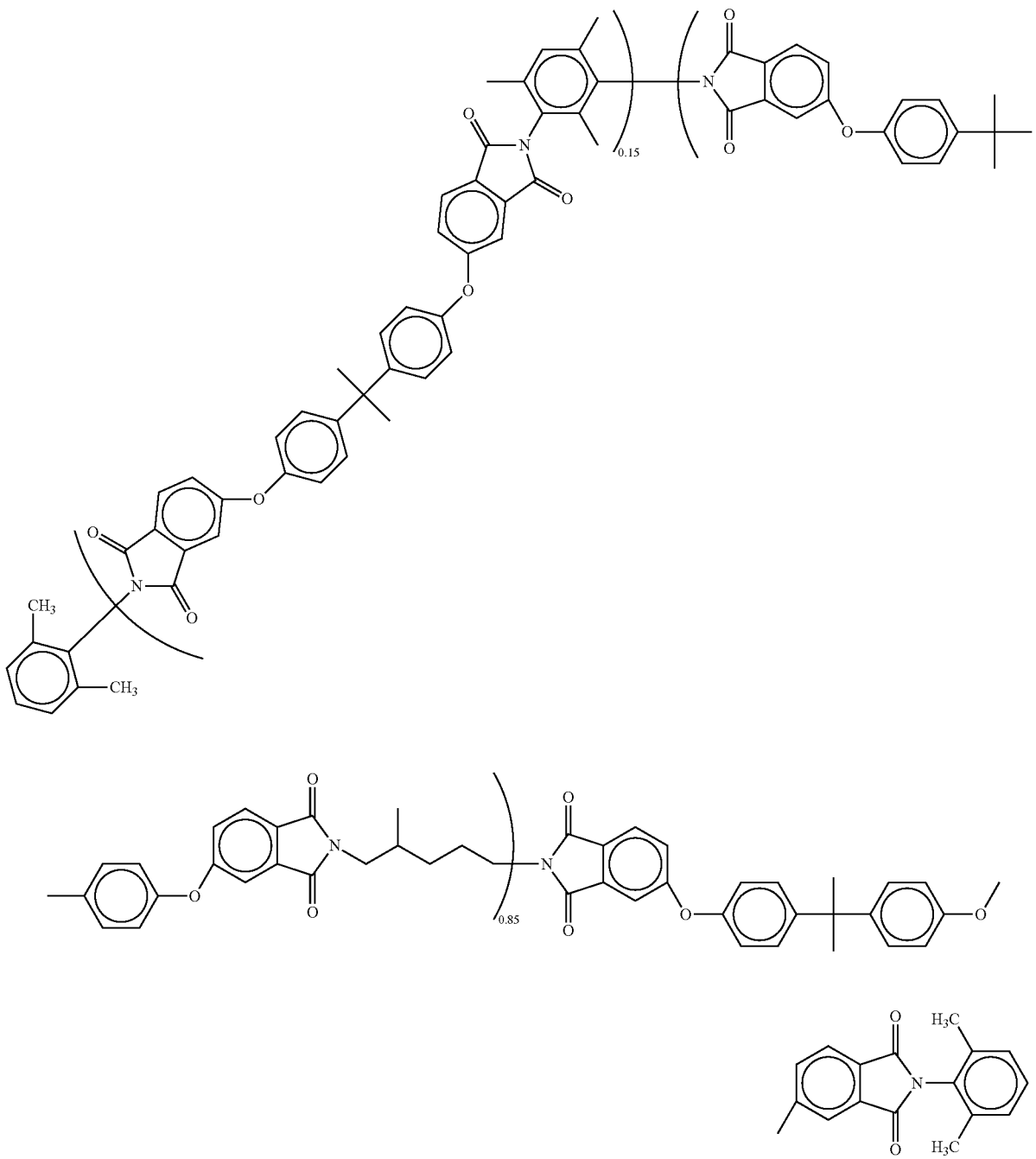

Example 18

Bisphenol-A-Dianhydride-co-3,3'-Diaminodiphenyl Sulfone-co-2-5 Methyl-1,5-Pentanediamine Oligomers End-Terminated with Cyclohexylamine

In this procedure, 4,4'-Bisphenol-A-dianhydride (10.0 grams, 19.2 mmol), 3,3'-diaminodiphenyl sulfone (2.220 grams, 8.9 mmol), 2-Methyl-1,5-Pentanediamine (commercially available from Invista under trade name of Dytek-A, 1.039 grams, 8.9 mmol), and cyclohexylamine (0.273 grams, 2.8 mol) were dissolved in N-methyl-2-pyrrolidone up to a final concentration of 10 wt. %. The solution was allowed to stir at room temperature under an inert atmosphere for 12 hours. Xylene (9.0 grams) was added to the resulting amic-acid solution in order to form an azeotropic solution to remove water during imidization, carried out by heating the solution to 180° C. for additional 12 hours. The resulting imide solutions were spin coated at 1,500 rpm at 60 seconds to form void-free, homogeneous films.

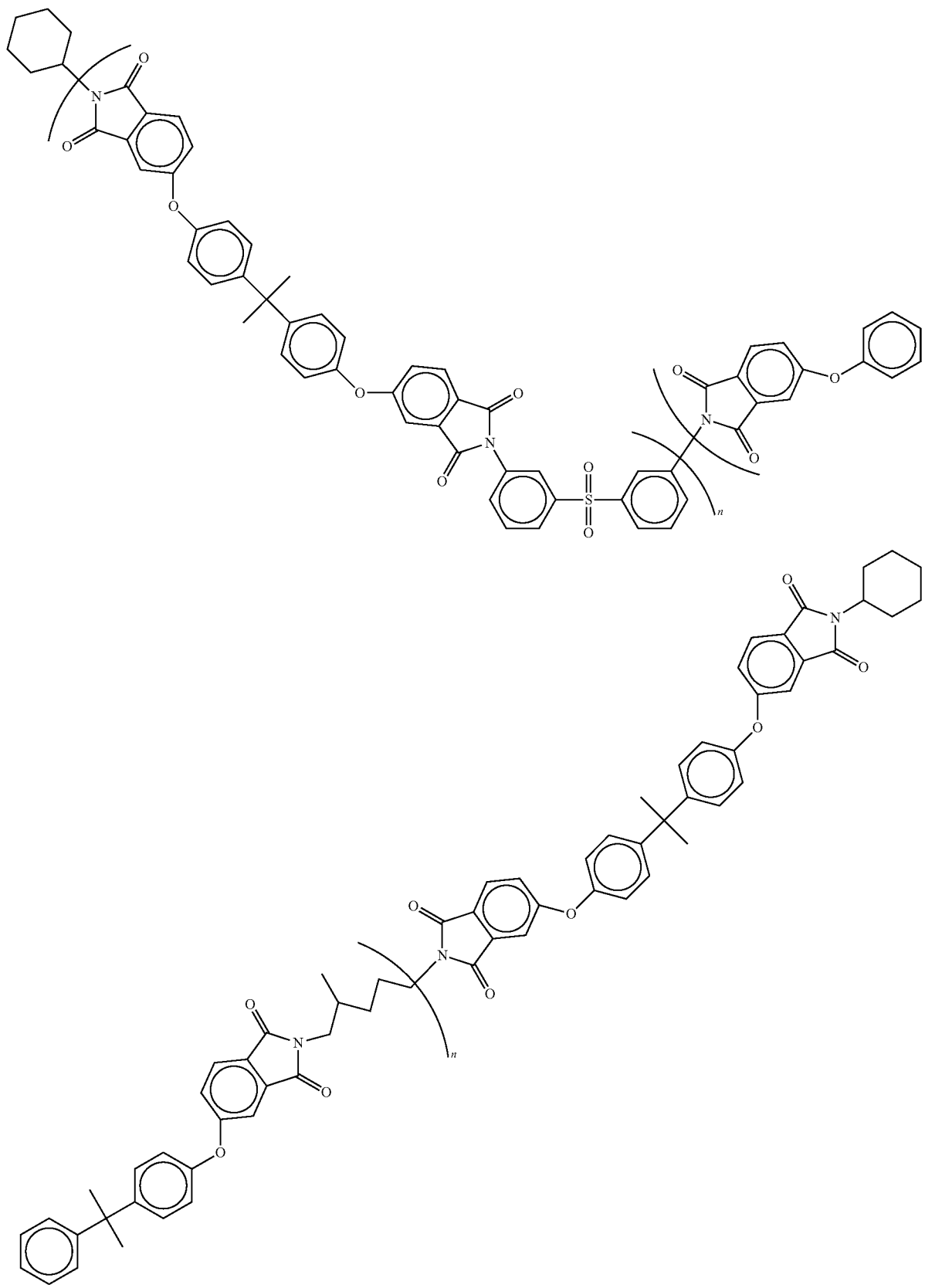

Example 19

Bisphenol-A-Dianhydride-co-2,4,6-Trimethyl-m-Phenylenediamine-co-1,2-Diaminocyclohexane Oligomers End-Terminated with Cyclohexylamine In this Example, 4,4'-Bisphenol-A-dianhydride (10.0 grams, 19.2 mmol), 2,4,6-trimethyl-m-phenylenediamine (0.663 grams, 4.42 mmol), 1,2-diaminocyclohexane (1.514 grams, 13.26 mmol), and cyclohexylamine (0.317 grams, 3.2 mmol) were dissolved in N-methyl-2-pyrrolidone up to a final concentration of 10 wt. %. The solution was allowed to stir at room temperature under an inert atmosphere for 12 hours. Xylene (8.3 grams) was added to the resulting amic-acid solution in order to form all azeotropic solution to remove water during imidization, carried out by heating the solution to 180° C. for an additional 12 hours. The resulting imide solutions were spin coated at 1,500 rpm for 60 seconds to form void-free, homogeneous films.

Example 20

Bisphenol-A-Dianhydride-co-2,4,6-Trimethyl-m-Phenylenediamine-co-4,4'-Methylene-Bis-Cyclohexylamine Oligomers End-Terminated with Cyclohexylamine In this procedure, 4,4'-Bisphenol-A-dianhydride (10.0 grams, 19.2 mmol), 2,4,6-trimethyl-m-phenylenediamine (0.657 grams, 4.38 mmol), 4,4'-methylene-bis-cyclohexylamine (2.762 grams, 13.13 mmol), and cyclohexylamine (0.355 grams, 3.58 mmol) were dissolved in N-methyl-2-pyrrolidone up to a final concentration of 10 wt. %. The solution was allowed to stir at room temperature under an inert atmosphere for 12 hours. Xylene (9.2 grams) was added to the resulting amic-acid solution in order to form an azeotropic solution to remove water during imidization, which was carried out by heating the solution to 180° C. for an additional 12 hours. The resulting imide solutions were spin coated at 1,500 rpm for 60 seconds to form void-free, homogeneous films.

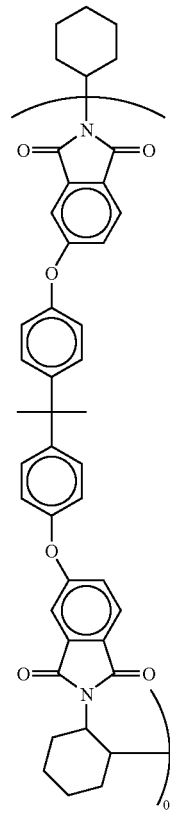
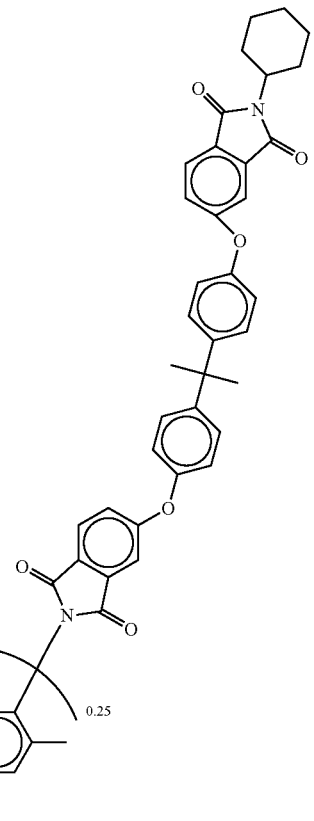

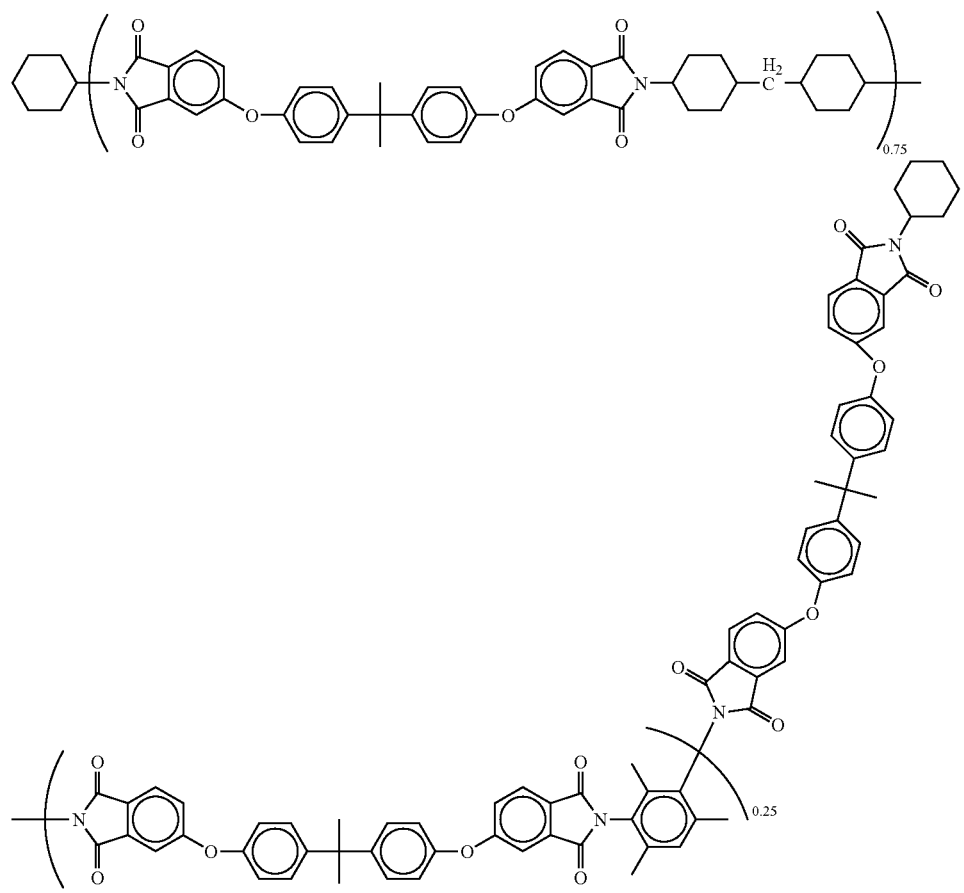

Example 21

The viscosity, softening point, and $T_g$, of the compositions of Examples 15, 16, 19, and 20 are reported in Table 4, while the values of the compositions of Examples 17-18 are reported in Table 5. Further studies on thermal stability and chemical resistance were carried out on these compositions. All of these compositions possessed the required thermal stability of at least up to 350° C. and exhibited minimal out-gassing (<0.5 wt. %).

TABLE 4

Properties of Examples 15-16 and 19-20

| EXAM-PLE | VISCOSITY (Pa·S, 350° C.) | Softening Temperature (in ° C. at 3,000 Pa·S) | Weight Loss (Isothermal at 350° C. for 4 hrs) | Molecular Weight (Mn, Daltons) | $T_g$ (° C.) |
|---|---|---|---|---|---|
| 15 | 4.943 | 240 | 1.420% | 3,940 | 176 |
| 16 | 169.6 | 299 | 0.1740% | 19,800 | 207 |
| 19 | 0.796 | 239 | 3.173% | 4,780 | 185 |
| 20 | 29.47 | 273 | 0.866% | 9,810 | 202 |

TABLE 5

Properties of Examples 17-18

| EXAM-PLE | VISCOSITY (Pa·S, 350° C.) | Softening Temperature (in ° C. at 3,000 Pa·S) | Weight Loss (Isothermal at 350° C. for 4 hrs) | Molecular Weight (Mn, Daltons) | $T_g$ (° C.) |
|---|---|---|---|---|---|
| 17 | 22.52 | 214 | 0.6721% | 12,700 | 144 |
| 18 | 4.451 | 208 | 1.557% | 5,870 | 150 |

We claim:

1. A composition useful for bonding two substrates together, said composition comprising a compound dissolved or dispersed in a solvent system, said compound being selected from the group consisting of polymers and oligomers comprising repeating units of Formulas (I) and (II):

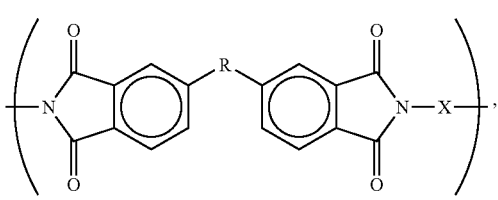

(I)

wherein:
R is selected from the group consisting of

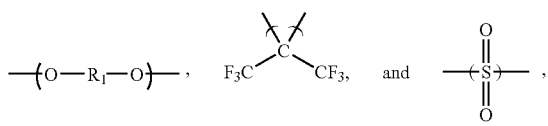

wherein $R_1$ is selected from the group consisting of alkyl-substituted phenyls,

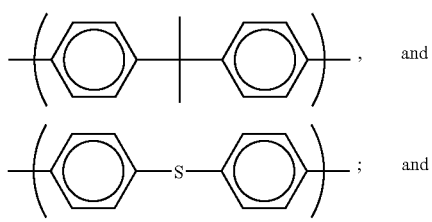

X is selected from the group consisting of phenyl sulfones, aromatics, aliphatics, and cyclic aliphatics,

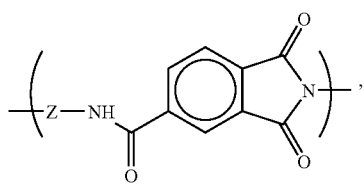 (II)

where Z is a moiety comprising an ether bridge selected from the group consisting of

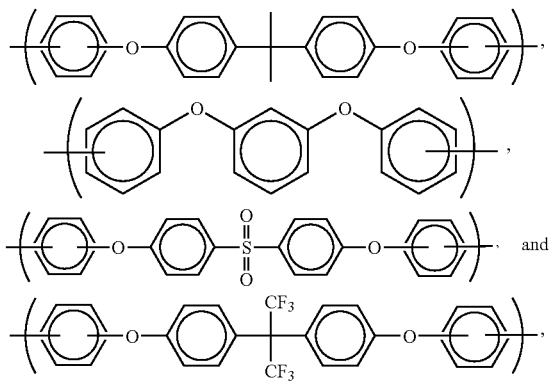

wherein said compound further comprises an endcap group derived from a compound selected from the group consisting of aromatic mono-amines, aliphatic mono-amines, cyclo-aliphatic mono-amines, and phthalic anhydrides.

2. The composition of claim 1, wherein X is selected from the group consisting of alkyl-substituted phenyls, isopropylidenediphenyl, and hexafluoroisopropylidene.

3. The composition of claim 1, wherein said endcap group is selected from the group consisting of alkyls,

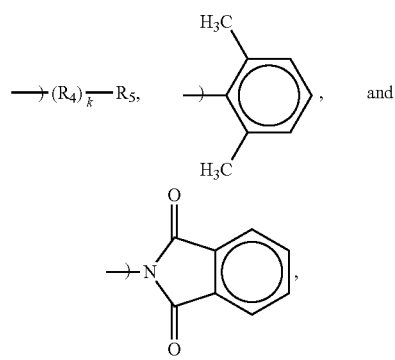

where:
$R_4$ is an alkyl;
$R_5$ is a cyclic aliphatic group; and
k is 0 to 20.

4. The composition of claim 1, wherein said solvent system comprises a solvent selected from the group consisting of N-methyl-2-pyrrolidone, xylene, dimethylacetamide, N,N-dimethylformamide, dimethyl sulfoxide, and mixtures thereof.

5. The composition of claim 1, wherein said composition comprises at least about 30% by weight solvent system, based upon the total weight of the composition taken as 100% by weight.

6. The composition of claim 1, said composition further comprising surfactants, adhesion promoting agents, plasticizers, antioxidants, and combinations thereof dispersed or dissolved with the compound in the solvent system.

7. A polymer or oligomer comprising repeating units of Formulas (I) and (II):

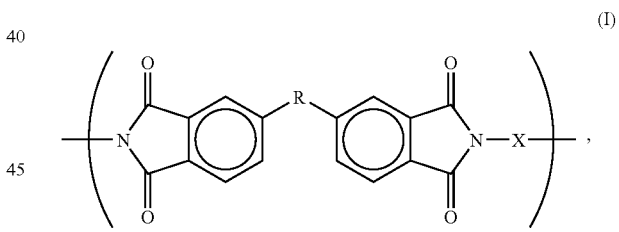 (I)

wherein:
R is selected from the group consisting of

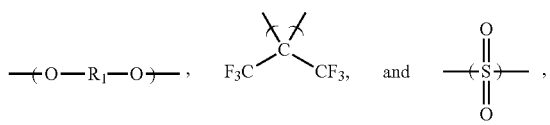

wherein $R_1$ is selected from the group consisting of alkyl-substituted phenyls,

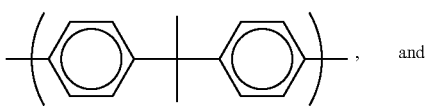

-continued

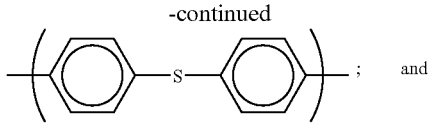
and

X is selected from the group consisting of cyclic aliphatics, (II)
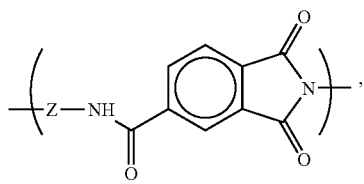

where Z is a moiety comprising an ether bridge selected from the group consisting of

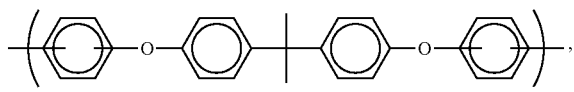

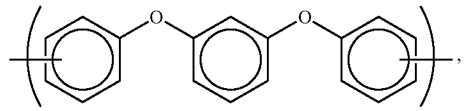

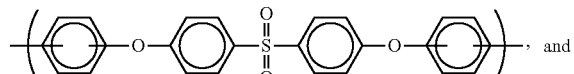, and

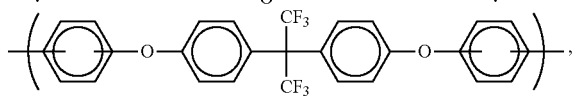

wherein said polymer or oligomer further comprises an endcap group derived from a compound selected from the group consisting of aromatic mono-amines, aliphatic mono-amines, cyclo-aliphatic mono-amines, and phthalic anhydrides.

8. The polymer or oligomer of claim 7, wherein said endcap group is selected from the group consisting of alkyls,

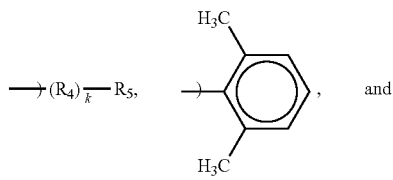 and

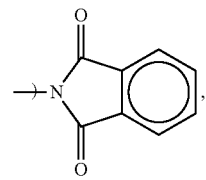

where:
R$_4$ is an alkyl;
R$_5$ is a cyclic aliphatic group; and
k is 0 to 20.

9. A composition useful for bonding two substrates together, said composition comprising a compound dissolved or dispersed in a solvent system, said compound being selected from the group consisting of polymers and oligomers comprising repeating units of Formulas (I) and (III):

(I)
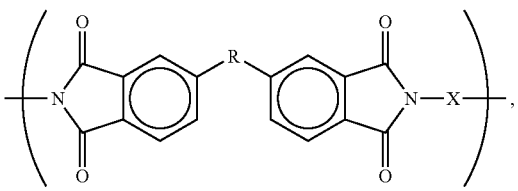

and (III)
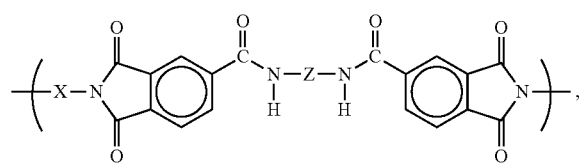

wherein:
R is selected from the group consisting of

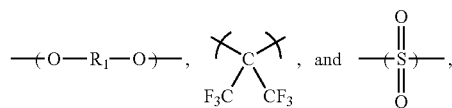

wherein R$_1$ is selected from the group consisting of alkyl-substituted phenyls,

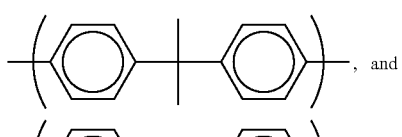, and

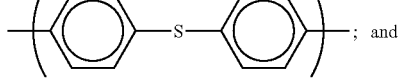; and each X is individually selected from the group consisting of alkyl-substituted phenyls, isopropylidenediphenyl, and hexafluoroisopropylidene; and
Z is a siloxane having the formula

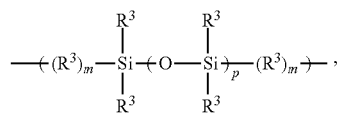

where:
each R$^3$ is individually selected from the group consisting of hydrogen, alkyls, and phenyls;
m is 1 to 6; and
p is 1 to 50; and
wherein said compound further comprises an endcap group derived from a compound selected from the group consisting of aromatic mono-amines, aliphatic mono-amines, cyclo-aliphatic mono-amines, and phthalic anhydrides.

10. The composition of claim 9, wherein said solvent system comprises a solvent selected from the group consisting of N-methyl-2-pyrrolidone, xylene, dimethylacetamide, N,N-dimethylformamide, dimethyl sulfoxide, and mixtures thereof.

11. The composition of claim 9, wherein said composition comprises at least about 30% by weight solvent system, based upon the total weight of the composition taken as 100% by weight.

12. The composition of claim 9, said composition further comprising surfactants, adhesion promoting agents, plasticizers, antioxidants, and combinations thereof dispersed or dissolved with the compound in the solvent system.

13. A polymer or oligomer comprising repeating units of Formulas (I) and (III):

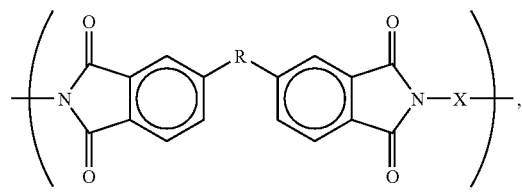

(I)

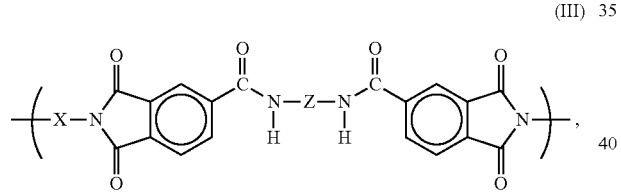

(III)

wherein:
R is selected from the group consisting of

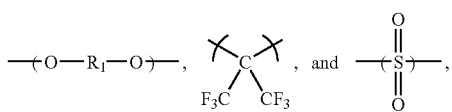

wherein $R_1$ is selected from the group consisting of alkyl-substituted phenyls,

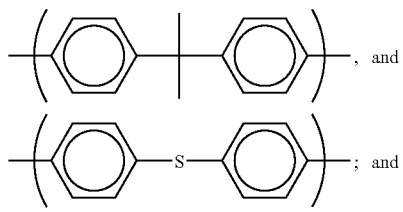

each X is individually selected from the group consisting of alkyl-substituted phenyls, isopropylidenediphenyl, and hexafluoroisopropylidene; and
Z is a siloxane having the formula

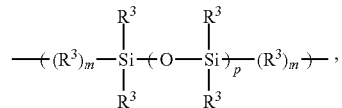

where:
each $R^3$ is individually selected from the group consisting of hydrogen, alkyls, and phenyls;
m is 1 to 6; and
p is 1 to 50; and
wherein said compound further comprises an endcap group derived from a compound selected from the group consisting of aromatic mono-amines, aliphatic mono-amines, cyclo-aliphatic mono-amines, and phthalic anhydrides.

* * * * *